(12) United States Patent
Kanemura et al.

(10) Patent No.: US 9,865,656 B2
(45) Date of Patent: Jan. 9, 2018

(54) SEMICONDUCTOR MEMORY DEVICE

(71) Applicant: Toshiba Memory Corporation, Minato-ku (JP)

(72) Inventors: Takahisa Kanemura, Yokohama (JP); Takashi Izumida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/271,453

(22) Filed: Sep. 21, 2016

(65) Prior Publication Data

US 2017/0236872 A1  Aug. 17, 2017

Related U.S. Application Data

(60) Provisional application No. 62/294,637, filed on Feb. 12, 2016.

(51) Int. Cl.
*H01L 45/00* (2006.01)
*H01L 27/24* (2006.01)
(Continued)

(52) U.S. Cl.
CPC ........ *H01L 27/2481* (2013.01); *G11C 13/004* (2013.01); *G11C 13/0007* (2013.01);
(Continued)

(58) Field of Classification Search
CPC ............. H01L 27/2481; H01L 27/2436; H01L 45/146; H01L 45/1233; H01L 45/1608; H01L 23/528
(Continued)

(56) References Cited

U.S. PATENT DOCUMENTS 6,295,227 B1 * 9/2001 Sakui .................. G11C 8/14
257/E27.103
8,822,971 B2  9/2014 Park et al.
(Continued)

FOREIGN PATENT DOCUMENTS

JP  2013-115436  6/2013
JP  2015-19048   1/2015
JP  2015-50462   3/2015

*Primary Examiner* — Dao H Nguyen
(74) *Attorney, Agent, or Firm* — Oblon, McClelland, Maier & Neustadt, L.L.P.

(57) ABSTRACT

A semiconductor memory device according to an embodiment includes a memory cell array that includes a plurality of memory cells. The memory cell array comprises: a plurality of first conductive layers that are stacked in a first direction above a substrate and extend in a second direction intersecting the first direction; a second conductive layer extending in the first direction; a variable resistance film provided at intersections of the plurality of first conductive layers and the second conductive layer; a first select transistor disposed closer to a side of the substrate than a lowermost layer of the plurality of first conductive layers, the first select transistor including a first select gate line intersecting the second conductive layer; a third conductive layer that extends in a third direction intersecting the second direction and is connected to a lower end of the second conductive layer via the first select transistor; and a second select transistor disposed between at least one pair of the plurality of first conductive layers adjacent in the first direction, the second select transistor including a second select gate line intersecting the second conductive layer.

13 Claims, 23 Drawing Sheets

(51) Int. Cl.
  *H01L 21/28*   (2006.01)
  *G11C 11/35*   (2006.01)
  *H01L 23/528*  (2006.01)
  *G11C 13/00*   (2006.01)

(52) U.S. Cl.
  CPC ........ *H01L 23/528* (2013.01); *H01L 27/2436* (2013.01); *H01L 45/1233* (2013.01); *H01L 45/146* (2013.01); *H01L 45/1608* (2013.01); *G11C 2013/0045* (2013.01); *G11C 2213/32* (2013.01); *G11C 2213/71* (2013.01); *G11C 2213/75* (2013.01)

(58) Field of Classification Search
  USPC ............... 257/3, 4, 5, 315, E27.103, E21.35, 257/E21.69, E29.323, E47.001; 365/51, 365/63, 185.11, 185.17; 438/287, 382
  See application file for complete search history.

(56) References Cited

U.S. PATENT DOCUMENTS

| | | | | |
|---|---|---|---|---|
| 8,891,277 B2* | 11/2014 | Murooka | ................ | G11C 5/06 365/148 |
| 2007/0165459 A1* | 7/2007 | Nazarian | ............ | G11C 16/0491 365/185.17 |
| 2011/0085377 A1* | 4/2011 | Mizukami | ................ | G11C 5/02 365/184 |
| 2013/0200331 A1* | 8/2013 | Morikawa | ........... | H01L 45/1608 257/5 |
| 2014/0198583 A1* | 7/2014 | Kern | ...................... | G11C 16/10 365/185.33 |
| 2015/0014622 A1 | 1/2015 | Kanno et al. | | |
| 2015/0035065 A1 | 2/2015 | Park et al. | | |

* cited by examiner

SEMICONDUCTOR MEMORY DEVICE

CROSS REFERENCE TO RELATED APPLICATION

This application is based upon and claims the benefit of priority from U.S. Provisional Patent Application No. 62/294,637, filed on Feb. 12, 2016, the entire contents of which are incorporated herein by reference.

FIELD

The present embodiments relate to a semiconductor memory device.

BACKGROUND

In recent years, along with an increasingly high level of integration of a semiconductor memory device, an LSI element configuring the semiconductor memory device has been getting more and more miniaturized. A ReRAM (Resistive RAM) that utilizes as memory a variable resistance element whose resistance value is reversibly changed, has been proposed as this LSI element. In this ReRAM, an even higher level of integration of a memory cell array has been made possible by a structure in which the variable resistance element is provided at an intersection of a word line extending in a direction along a substrate surface and a bit line extending perpendicularly in a direction intersecting the substrate surface.

DETAILED DESCRIPTION

A semiconductor memory device according to an embodiment described below includes a memory cell array that includes a plurality of memory cells. The memory cell array comprises: a plurality of first conductive layers that are stacked in a first direction above a substrate and extend in a second direction intersecting the first direction; a second conductive layer extending in the first direction; a variable resistance film provided at intersections of the plurality of first conductive layers and the second conductive layer; a first select transistor disposed more to a side of the substrate than is a lowermost layer of the first conductive layers, the first select transistor including a first select gate line intersecting the second conductive layer; a third conductive layer that extends in a third direction intersecting the second direction and is connected to a lower end of the second conductive layer via the first select transistor; and a second select transistor disposed between at least one pair of the plurality of first conductive layers adjacent in the first direction, the second select transistor including a second select gate line intersecting the second conductive layer.

First Embodiment

[Configuration]

Figure 1:
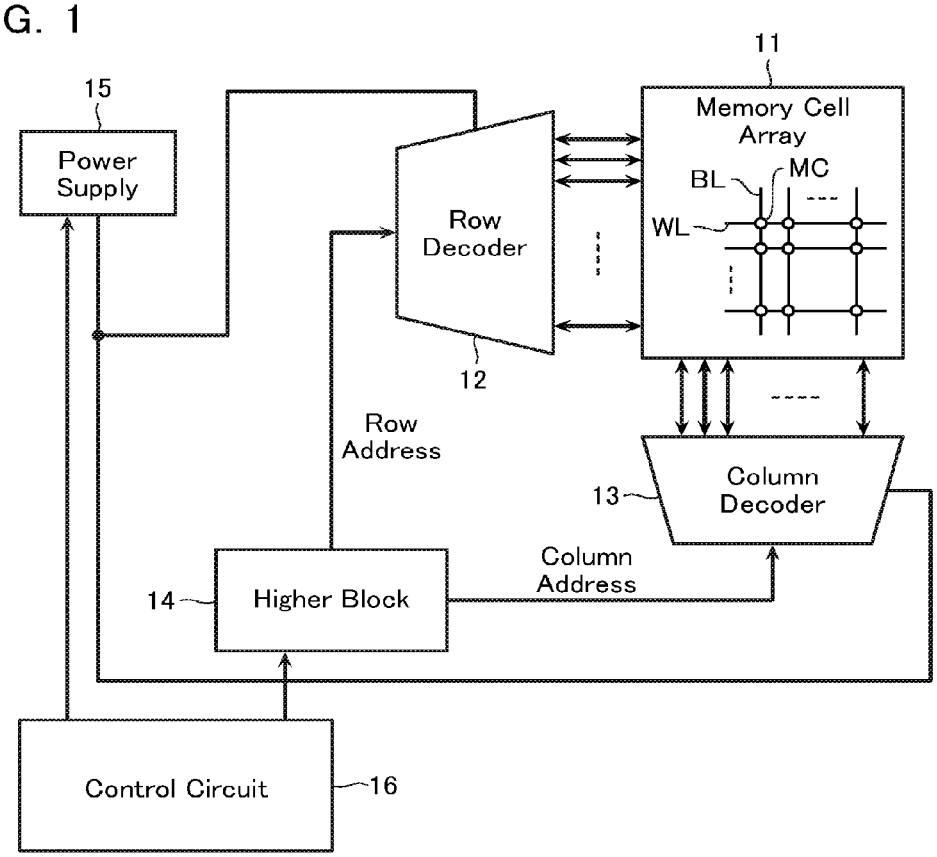
FIG. 1 is an example of a block diagram of a semiconductor memory device according to a first embodiment.

An overall configuration of a semiconductor memory device according to a first embodiment will be described. FIG. 1 is an example of a block diagram of the semiconductor memory device according to the first embodiment. As shown in FIG. 1, the semiconductor memory device includes: a memory cell array 11; a row decoder 12; a column decoder 13; a higher block 14; a power supply 15; and a control circuit 16.

The memory cell array 11 includes: a plurality of word lines WL and bit lines BL that intersect each other; and a memory cell MC disposed at each of intersections of these word lines WL and bit lines BL. The row decoder 12 selects the word line WL during access (data erase/write/read). The column decoder 13 selects the bit line BL during access, and includes a driver that controls an access operation.

The higher block 14 selects the memory cell MC which is to be an access target in the memory cell array 11. The higher block 14 provides a row address and a column address to, respectively, the row decoder 12 and the column decoder 13. The power supply 15 generates certain combinations of voltages corresponding to each of operations of data erase/write/read, and supplies these combinations of voltages to the row decoder 12 and the column decoder 13. The control circuit 16 performs control of, for example, sending the addresses to the higher block 14, and, moreover, performs control of the power supply 15, based on a command from external.

Figure 2:
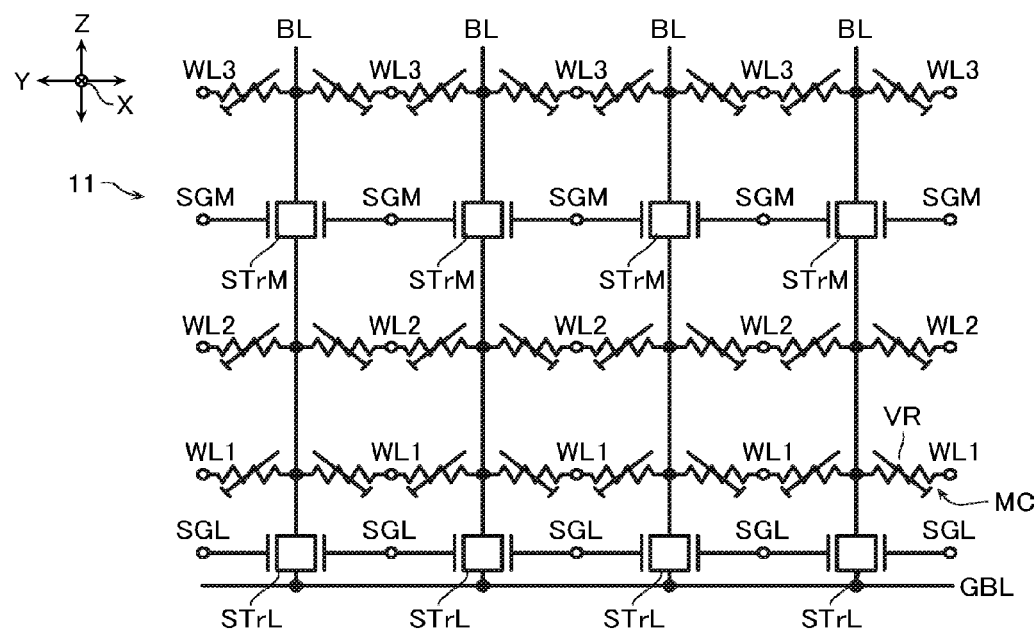
FIG. 2 is an example of an equivalent circuit diagram of a memory cell array 11 according to the first embodiment.
Figure 3:
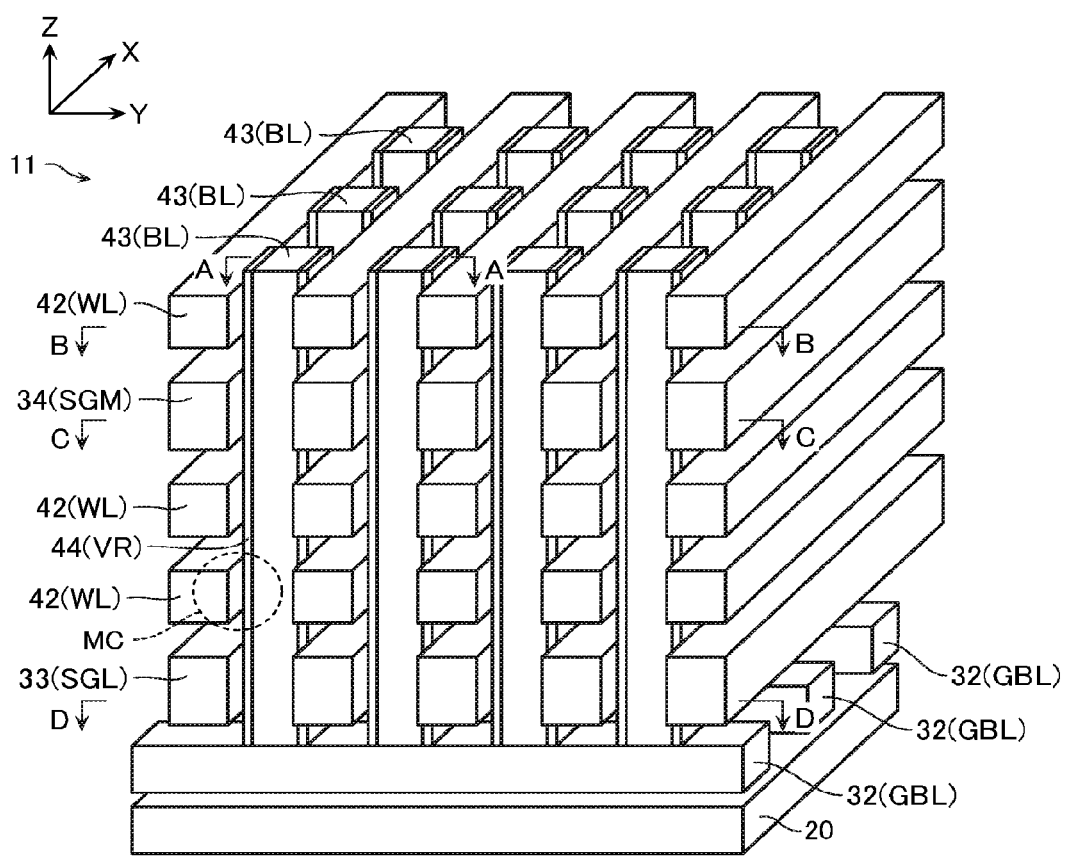
FIG. 3 is an example of a perspective view showing a structure of part of the memory cell array 11 included in the semiconductor memory device according to the first embodiment.

Next, a schematic configuration of the memory cell array 11 according to the first embodiment will be described in detail with reference to FIGS. 2 and 3. FIG. 2 is an example of a circuit diagram of the memory cell array 11. FIG. 3 is an example of a perspective view showing the schematic configuration of the memory cell array 11. Note that in FIG. 3, an X direction, a Y direction, and a Z direction are orthogonal to each other, and the X direction is a direction perpendicular to a plane of paper. In addition, a structure shown in FIG. 2 is provided repeatedly in the X direction.

As shown in FIG. 2, the memory cell array 11 includes a lower select transistor STrL, a middle select transistor STrM, a global bit line GBL, a lower select gate line SGL, and a middle select gate line SGM, in addition to the above-mentioned word line WL (WL1 to WL3), bit line BL, and memory cell MC. Note that hereafter, the word lines WL1 to WL3 will sometimes be referred to simply as word line WL. In addition, the lower select transistor STrL and the middle select transistor STrM will sometimes be collectively referred to simply as select transistor STr, and the lower select gate line SGL and the middle select gate line SGM will sometimes be collectively referred to simply as select gate line SG.

As shown in FIGS. 2 and 3, the word lines WL are arranged in the Y direction and the Z direction above a substrate 20, and extend in the X direction. The bit lines BL are arranged in a matrix in the X direction and the Y direction, and extend in a column shape in the Z direction. The memory cells MC are disposed at places where these word lines WL and bit lines BL intersect. Therefore, the memory cells MC are arranged in a three-dimensional matrix in the X, Y, and Z directions.

As shown in FIGS. 2 and 3, the memory cell MC includes a variable resistance element VR. As shown in FIG. 3, the variable resistance element VR is provided integrally on a side surface in the Y direction of the bit line BL. The variable resistance element VR is capable of being electrically rewritten and stores data in a nonvolatile manner based on a resistance value of the variable resistance element VR. The variable resistance element VR changes from a high-resistance state (reset state) to a low-resistance state (set state) by a setting operation that applies a certain voltage or more to both ends of the variable resistance element VR, and changes from the low-resistance state (set state) to the high-resistance state (reset state) by a resetting operation that applies a certain voltage or more to both ends of the variable resistance element VR. In addition, the variable resistance element VR, immediately after manufacturing, is in a state where its resistance state is not easily changed, and is in the high-resistance state. Accordingly, a forming operation is executed. In the forming operation, a high voltage greater than or equal to those of the setting operation and the resetting operation is applied to the variable resistance element VR. As a result of this forming operation, a region (filament path) where locally it is easy for a current to flow is formed in the variable resistance element VR, whereby the variable resistance element VR can have its resistance state changed easily, and achieves a state of being operable as a storage element. However, the forming operation is not executed on the variable resistance element VR disposed between the select transistor STr and the bit line BL. In other words, the filament path is not formed in the variable resistance element VR (later-mentioned variable resistance film 44) disposed between the select transistor STr and the bit line. As a result, the variable resistance element (variable resistance film) disposed between the select transistor STr and the bit line BL functions as a gate insulating film of the select transistor STr.

The global bit line GBL is connected to a lower end of the bit line BL. The global bit line GBL extends in the Y direction as shown in FIGS. 2 and 3. In addition, as shown in FIG. 3, a plurality of the global bit lines GBL are arranged in the X direction corresponding to the bit lines BL. One global bit line GBL is commonly connected, via the lower select transistor STrL, to lower ends of the plurality of bit lines BL arranged in a line in the Y direction.

As shown in FIG. 2, the lower select transistor STrL is provided between the global bit line GBL and one end of the bit line BL. The lower select transistor STrL includes the lower select gate line SGL intersecting the bit line BL. In the present embodiment, only one layer of the lower select gate lines SGL is provided. The middle select transistor STrM is provided between the word lines WL adjacent in the Z direction. The middle select transistor STrM includes the middle select gate line SGM intersecting the bit line BL. In the present embodiment, the middle select gate line SGM is provided between the word line WL2 and the word line WL3.

Gate electrodes of the two lower select transistors STrL arranged adjacently in the Y direction are commonly connected by the lower select gate line SGL. In addition, gate electrodes of the two middle select transistors STrM arranged adjacently in the Y direction are commonly connected by the middle select gate line SGM. Note that it is also possible to isolate gate electrodes of the two select transistors STr arranged adjacently in the Y direction and thereby operate each of the two select transistors STr independently.

Note that in the present embodiment, a thickness in the Z direction of the select gate line SG is configured larger than a thickness in the Z direction of the word line WL. Moreover, a width in the Y direction of the select gate line SG is substantially identical to a width in the Y direction of the word line WL. This will be mentioned in detail later.

Figure 4:
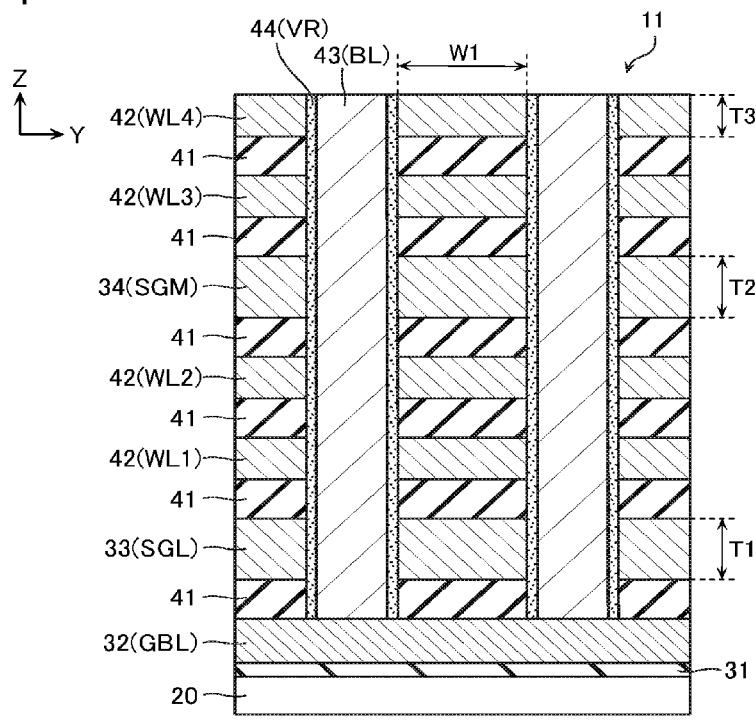
FIG. 4 is a Y-Z cross-sectional view, taken along the line A-A of FIG. 3, showing a configuration of part of the memory cell array 11 according to the first embodiment.
Figure 5A:
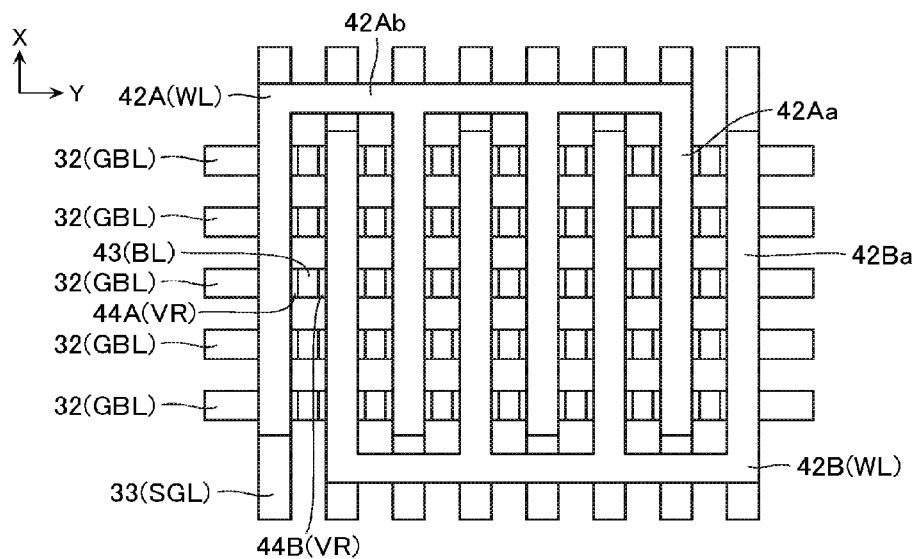
FIG. 5A is an X-Y cross-sectional view, taken along the line B-B of FIG. 3, showing a configuration of part of the same memory cell array 11.
Figure 5B:
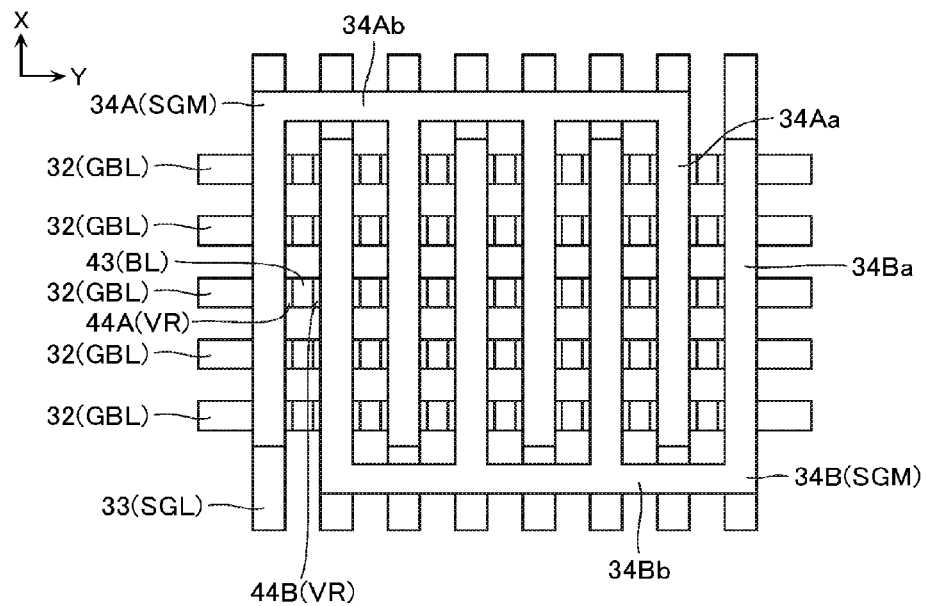
FIG. 5B is an X-Y cross-sectional view, taken along the line C-C of FIG. 3, showing a configuration of part of the same memory cell array 11.
Figure 5C:
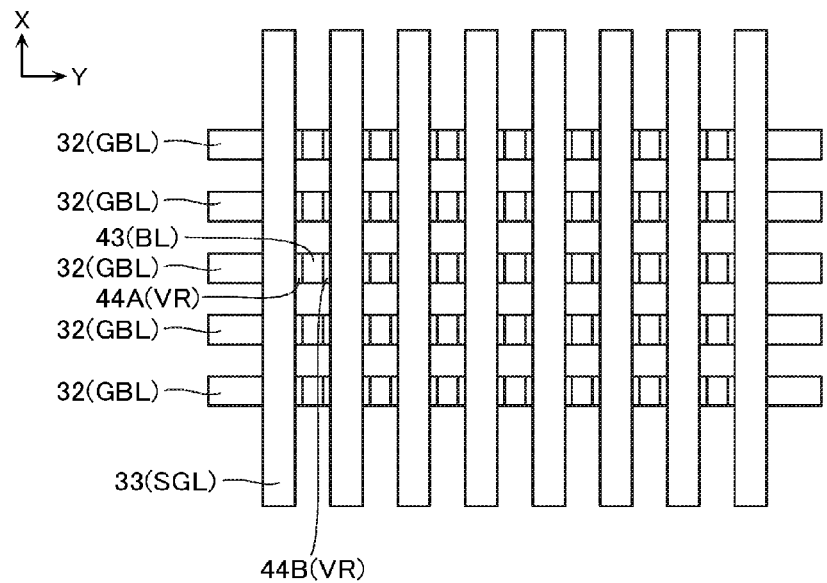
FIG. 5C is an X-Y cross-sectional view, taken along the line D-D of FIG. 3, showing a configuration of part of the same memory cell array 11.

Next, a structure of the memory cell array 11 according to the first embodiment will be described in detail with reference to FIG. 4 and FIGS. 5A to 5C. FIG. 4 is a Z-Y cross-sectional view taken along the line A-A of FIG. 3. FIGS. 5A to 5C are X-Y cross-sectional views respectively taken along the line B-B, the line C-C, and the line D-D, of FIG. 3. Note that in FIG. 4 and FIGS. 5A to 5C, part of the configuration is omitted.

As shown in FIG. 4, the memory cell array 11 includes the following stacked in the Z direction on the substrate 20, namely: an inter-layer insulating layer 31; a conductive layer 32; an inter-layer insulating layer 41; a conductive layer 33; a conductive layer 42; and a conductive layer 34.

In addition, as shown in FIG. 4, the memory cell array 11 includes a columnar semiconductor layer 43 and the variable resistance film 44.

The conductive layer 32 extends in the Y direction and is arranged in plurality in the X direction as shown in FIGS. 5A to 5C. The conductive layer 32 is connected to a lower end of the columnar semiconductor layer 43 (bit line BL). Moreover, the conductive layer 32 functions as the global bit line GBL.

As shown in FIG. 4, the conductive layer 33 is disposed between the substrate 20 and global bit line GBL and the lowermost layer conductive layer 42 (word line WL). Moreover, as shown in FIG. 5C, the conductive layer 33 extends in the X direction and is arranged in plurality in the Y direction. That is, the conductive layer 33 is configured from a plurality of conductive layers that extend in the X direction and are each independent. In this way, the conductive layer 33 is configured in a striped shape. This conductive layer 33 functions as a gate of the lower select transistor STrL (lower select gate line SGL). By forming the conductive layer 33 in a striped shape, the arranged plurality of conductive layers 33 become individually controllable. Therefore, the gates of the lower select transistors STrL become individually controllable, and selectivity improves.

As shown in FIG. 4, a plurality of the conductive layers 42 are stacked in the Z direction on the substrate 20. Moreover, as shown in FIG. 5A, the conductive layer 42 is configured from a pair of a conductive layer 42A and a conductive layer 42B. The pair of the conductive layer 42A and the conductive layer 42B each extend in the X direction and are respectively configured from: pluralities of branch parts 42Aa and branch parts 42Ba arranged in the Y direction; and a connecting part 42Ab and connecting part 42Bb commonly connected to ends in the X direction of the branch parts 42Aa and branch parts 42Ba. In this way, the conductive layer 42 is configured in a comb tooth shape having the pair of the conductive layer 42A and the conductive layer 42B meshed.

Moreover, the conductive layer 42 functions as the word line WL. Forming the conductive layer 42 in a comb tooth shape makes it possible to reduce the number of contacts connected to the word line WL. For example, assuming the number of word lines WL arranged along the Z direction and the Y direction to each be 32, the number of contacts required when the word line WL is not formed in a comb tooth shape is 32×32=1024. However, the number of contacts required when the word line WL is configured in a comb tooth shape is 32. Moreover, by combining the pair of the conductive layers 42A and 42B, two variable resistance films 44A and 44B can be caused to function independently with respect to one columnar semiconductor layer 43 (bit line BL). The number of contacts at this time is 64.

As shown in FIG. 4, the conductive layer 34 is provided between a pair of the conductive layers 42 (word lines WL) adjacent in the Z direction. Moreover, as shown in FIG. 5B, the conductive layer 34 is configured from a pair of a conductive layer 34A and a conductive layer 34B. The pair of the conductive layer 34A and the conductive layer 34B each extend in the X direction and are respectively configured from: pluralities of branch parts 34Aa and branch parts 34Ba arranged in the Y direction; and a connecting part 34Ab and connecting part 34Bb commonly connected to ends in the X direction of the branch parts 34Aa and branch parts 34Ba. In this way, the conductive layer 34 is configured in a comb tooth shape having the pair of the conductive layer 34A and the conductive layer 34B meshed. That is, the conductive layer 34 has a shape substantially identical to that of the conductive layer 42 shown in FIG. 5A.

Moreover, the conductive layer 34 functions as a gate of the middle select transistor STrM (middle select gate line SGM). Forming the conductive layer 34 in a comb tooth shape makes it possible to reduce the number of contacts connected to the conductive layer 34, similarly to in the case of the word line WL. For example, assuming the number of conductive layers 34 arranged along the Z direction and the Y direction to each be 32, the number of contacts required when the conductive layer 34 is not formed in a comb tooth shape is 32×32=1024. However, the number of contacts required when the conductive layer 34 is configured in a comb tooth shape is 32. Moreover, the number when the pair of the conductive layers 34A and 34B are combined is 64. The conductive layers 34A and 34B at this time are provided with an identical potential. This is because even if separate potentials are provided for the conductive layers 34A and 34B, a width in the Y direction of the semiconductor layer 43 (bit line BL) is small, hence a current flowing in the bit line BL cannot be independently controlled for a side surface (A side surface) on a conductive layer 34A side of the bit line BL and a side surface (B side surface) on a conductive layer 34B side of the bit line BL. In the present embodiment, the conductive layer 34A and the conductive layer 34B are configured isolated, but may be connected without being isolated.

Note that the conductive layers 32, 33, 34, and 42 are configured from polysilicon or a metal, for example. Moreover, the inter-layer insulating layers 31 and 41 are configured from silicon oxide ($SiO_2$), for example. Moreover, the inter-layer insulating layers 31 and 41 are configured from silicon oxide, for example.

As shown in FIG. 4, a thickness T1 in the Z direction of the conductive layer 33 and a thickness T2 in the Z direction of the conductive layer 34 are greater than a thickness T3 in the Z direction of the conductive layer 42. This is for the following reason. That is, although, as mentioned above, the conductive layer 33 and the conductive layer 34 function as the gates of the lower select transistor STrL and the middle select transistor STrM, if thicknesses of these conductive layers 33 and 34 is small, then it becomes easy for a leak current to be generated in the bit line BL when the lower select transistor STrL and/or the middle select transistor STrM is set to OFF, that is, OFF characteristics end up deteriorating.

In addition, widths in the Y direction of the conductive layer 33, the conductive layer 34, and the conductive layer 42 are each W1 and substantially identical. One reason for this is that if the widths of the conductive layer 33, the conductive layer 34, and the conductive layer 42 are made different, a manufacturing process ends up getting complicated. Now, when the thicknesses (T1, T2, and T3) and widths W1 of each of the conductive layer 33, the conductive layer 34, and the conductive layer 42 are compared, they are not necessarily configured as above, rather thicknesses differ or widths are substantially identical for average values of respective thicknesses or widths.

The columnar semiconductor layer 43 extends in the Z direction so as to penetrate a stacked body of the inter-layer insulating layer 41, the conductive layer 33, the conductive layer 42, and the conductive layer 34. The variable resistance film 44 is provided on a side surface in the Y direction of the columnar semiconductor layer 43. The columnar semiconductor layer 43 functions as the bit line BL. The variable resistance film 44 functions as the variable resistance element VR. Moreover, in the present embodiment, the variable resistance film 44 is provided integrally on the side surface of the columnar semiconductor layer 43. Therefore, the variable resistance film 44 is disposed also both between the conductive layer 42 functioning as the word line and the columnar semiconductor layer 43 and between the select gate lines 33 and 34 and the columnar semiconductor layer 43.

The columnar semiconductor layer 43 is configured by polysilicon, for example. The variable resistance film 44 is configured by, for example, a metal oxide (for example, $HfO_x$, $Al_2O_x$, $TiO_x$, $NiO_x$, $WO_x$, $Ta_2O_x$, and so on).

[Operation]

Figure 6:
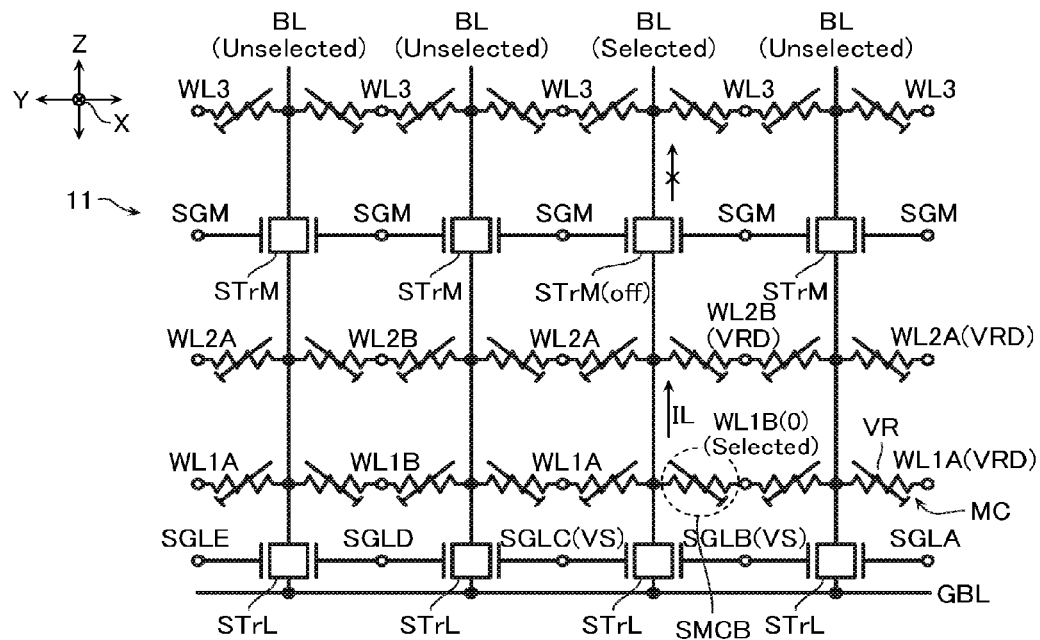
FIG. 6 is an example of a circuit diagram for explaining an operation in the same memory cell array 11.

Next, an outline of an operation of the semiconductor memory device according to the first embodiment will be described using the circuit diagram of FIG. 6.

When selecting one memory cell MC to be read, the bit line BL corresponding to the memory cell MC to be selected (selected memory cell SMCB) is selected by the column decoder 13. Specifically, lower select gate lines SGLB and SGLC corresponding to the bit line BL connected to the selected memory cell SMCB are applied with a certain voltage VS. Other select gate lines SGLA and SGLD are applied with a voltage VH, SGLE is applied with 0 V, and a select gate is set to Off. The voltage VH is a negative voltage at which select transistors on both sides of a half-selected bit line BL become Off. Simultaneously, a transistor of the global bit line GBL corresponding to the selected memory cell SMCB is set to On, and a voltage VRD is applied. Then, a word line WL1B connected to the selected memory cell SMCB is applied with 0 V, and other word lines WL1A and WL2A and WL2B are applied with the voltage VRD. As a result, a current flows from the global bit line GBL into the word line WL1B via the selected memory cell SMCB, and a resistance state of the selected memory cell SMCB can be determined by a magnitude of the current flowing in the word line WL1B.

Furthermore, focusing on WL1B, a current flows also from the word lines WL1A, WL2A, and WL2B applied with VRD, via an unselected memory cell (hereafter, UMC) connected to an unselected bit line BL, and from that unselected bit line BL, via a half-selected memory cell (hereafter, HMC) connected to the word line WL1B.

Actually, the number of HMCs is proportional to the number of unselected bit lines BL connected to the same word line WL. Hence, when the word line WL is configured as two pairs of comb tooth shaped word lines WLA and WLB, the number of HMCs is roughly proportional to the product of the number of combs of the word line WL and the number of global bit lines GBL, in other words, the total number of unselected bit lines BL. Moreover, if the word lines WL are made independent and not in a comb tooth shape, the number of HMCs is proportional to the number of global bit lines GBL. If there are few bit lines BL, the current via the HMCs can be ignored, but when the number of bit lines BL becomes numerous, the number of HMCs connected in parallel increases, and the current via the HMCs becomes larger than that via the SMC. As a result, the resistance state of the SMC becomes difficult to determine. Although the WLs being independent results in the number of contacts increasing, it is desirable in terms of judgment of resistance. Moreover, the number of UMCs is proportional to the product of the number of HMCs and the number of layers of =selected word lines WL.

In the present embodiment, the middle select transistor STrM positioned upwardly of the selected memory cell SMC is set to Off. As a result of this, a current stops flowing in the memory cells MC connected to the bit lines BL upward of the middle select transistor STrM. In other words, it becomes easier for resistance judgment of the selected memory cell SMC to be made. The middle select gate line SGM need only be provided with the same potential as to the GL connected by the identical word line WL. If there is one pair of comb tooth shaped middle select gate lines SGM, the number of contacts need only be one. If the word line WL has two pairs of comb tooth shapes, the middle select gate line SGM may also be configured as two pairs of comb tooth shapes similarly to the word line WL, whereby processing employing an identical mask is enabled, hence simplification of a manufacturing step is enabled. Moreover, if the word lines WL are a plurality of independent parallel lines not connected in the Y direction, then the middle select gate lines SGM may also be formed by a plurality of parallel lines similarly to the word lines WL. In this case, four middle select gate lines SGM need only be applied such that the middle select transistor STrM of the two bit lines BL adjacent in the Y direction to the selected bit line BL becomes Off, and lowering of capacitance around the middle select gate lines SGM is enabled.

Note that as mentioned above, the variable resistance element VR disposed between the select transistor STr and the bit line BL does not have the filament path formed therein, and functions as the gate insulating film which is an ordinary insulating film. Therefore, it also never happens that device characteristics deteriorate due to the variable resistance element VR between the select transistor STr and the bit line BL.

[Method of Manufacturing]

Next, a method of manufacturing the semiconductor memory device according to the first embodiment will be described with reference to FIGS. 7 to 10. FIGS. 7 to 10 are examples of schematic perspective views showing a method of manufacturing the memory cell array 11. Note that in the method of manufacturing described below, a configuration of part including a portion in a layer above the conductive layer 34 (middle select gate line SGM), is omitted.

Figure 7:
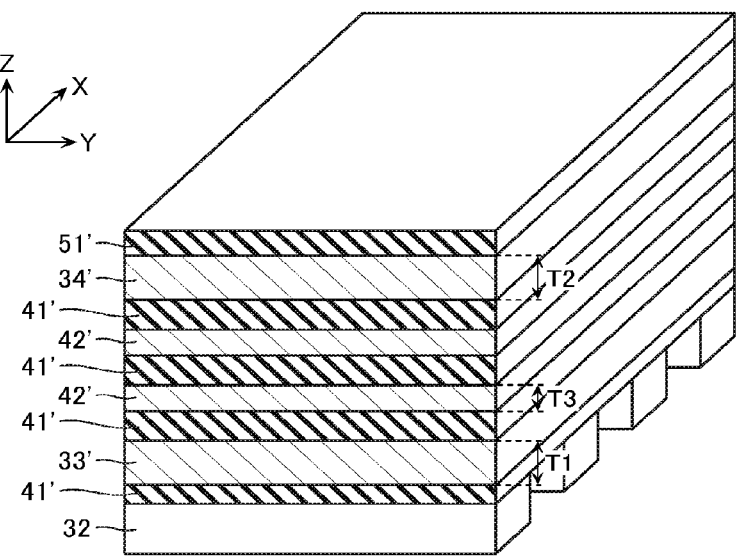
FIGS. 7 to 10 are examples of perspective views showing a method of manufacturing the memory cell array 11 according to the first embodiment.

As shown in FIG. 7, silicon oxide ($SiO_2$) and polysilicon (Si) are alternately stacked on an upper surface of the global bit line 32, and an inter-layer insulating layer 41', conductive layers 33', 34', and 42', and a protective layer 51' that extend in the X direction and the Y direction, are formed. Now, the thicknesses T1 and T2 in the Z direction of the conductive layers 33' and 34' are greater than the thickness T3 in the Z direction of the conductive layer 42'.

Figure 8:
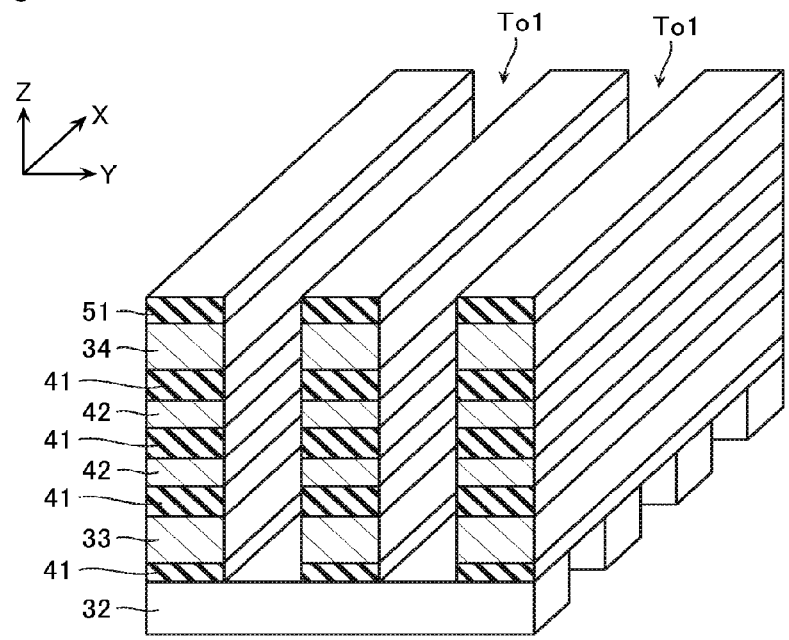

As shown in FIG. 8, a trench To1 penetrating the inter-layer insulating layer 41' and the conductive layers 33', 34', and 42', is formed. The trenches To1 are arranged with a certain pitch in the Y direction and extend in the X direction. Due to this trench To1, the inter-layer insulating layer 41', the conductive layers 33', 34', and 42', and the protective layer 51' become the inter-layer insulating layer 41, the conductive layers 33, 34, and 42, and a protective layer 51 that extend in the X direction.

Figure 9:
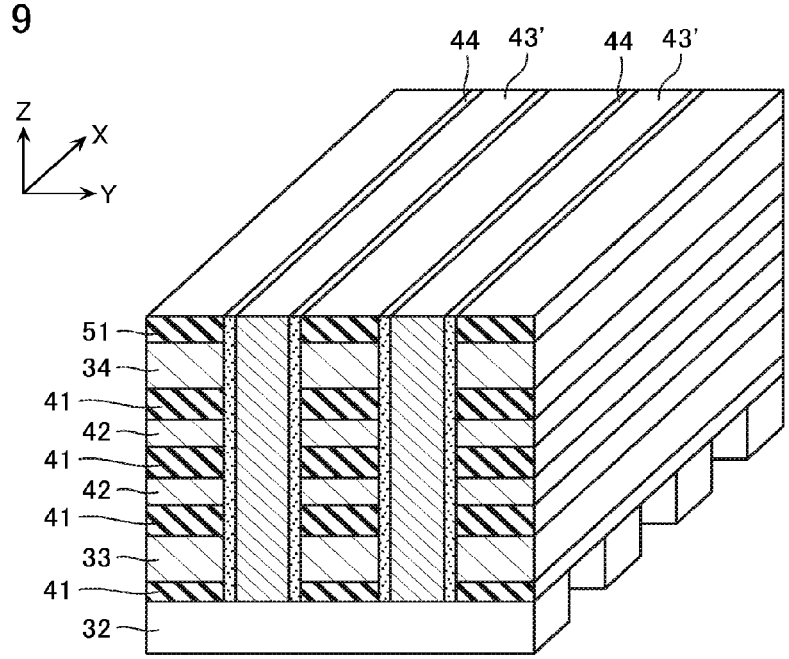

As shown in FIG. 9, the variable resistance film 44 is formed on side surfaces in the Y direction of the inter-layer insulating layer 41 and the conductive layers 33, 34, and 42 exposed by formation of the trench To1. Then, a semiconductor layer 43' is formed so as to fill the trench To1. For example, the variable resistance film 44 is formed by depositing a metal oxide by Atomic Layer Deposition (ALD). Now, the variable resistance film 44 is formed in a sheet on the entirety of side surfaces in the Y direction of the inter-layer insulating layer 41 and the conductive layers 33, 34, and 42.

Figure 10:
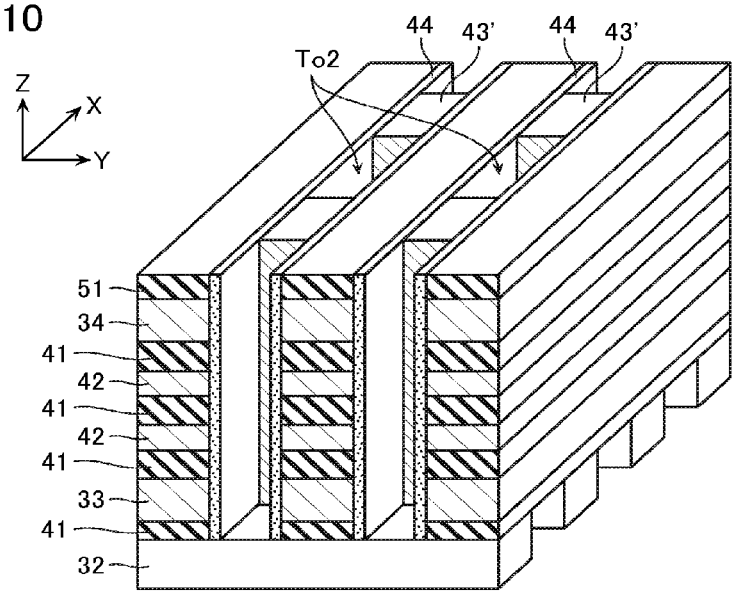

As shown in FIG. 10, a trench To2 penetrating the semiconductor layer 43' to divide the semiconductor layer 43' in the X direction, is formed. The trenches To2 are arranged with a certain pitch in the X direction. Due to this trench To2, the semiconductor layer 43' becomes the columnar semiconductor layer 43.

Finally, the trench To2 is filled by the likes of silicon oxide to form the inter-layer insulating layer 41 in the trench To2, and the protective layer 51 is removed to obtain the configuration of FIG. 4.

Modified Example

Figure 17:
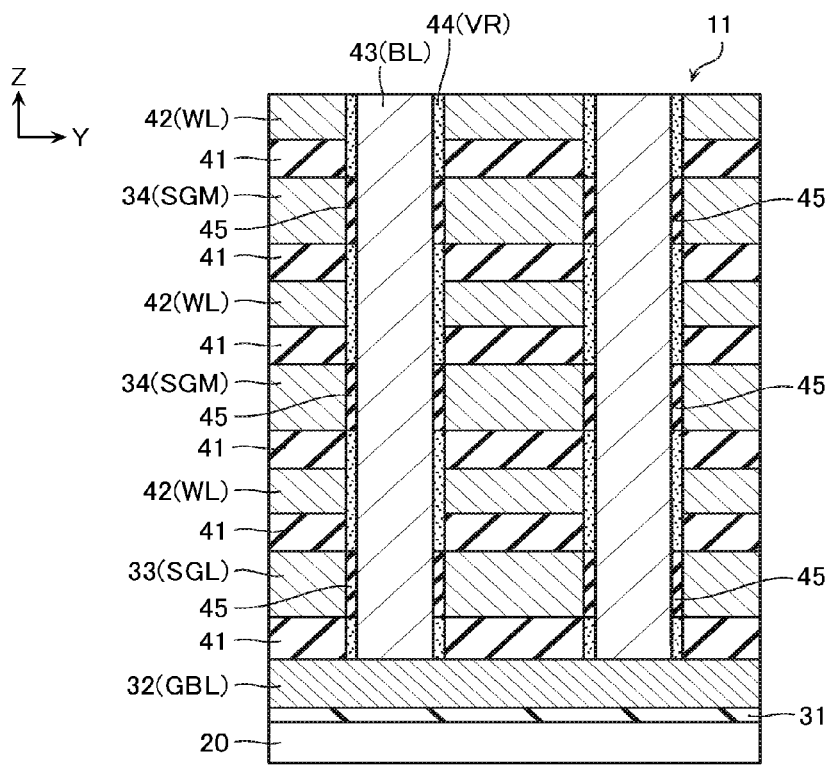
FIG. 17 is a Y-Z cross-sectional view showing a modified example of the memory cell array 11 according to the first embodiment.

Next, a modified example related to the above-described first embodiment will be described using FIG. 17. FIG. 17 is a schematic cross-sectional view showing a configuration of part of a semiconductor memory device according to the modified example related to the first embodiment.

As shown in FIG. 17, in the present modified example, a configuration of the variable resistance element VR and an arrangement of the middle select gate line SGM are different from those of the first embodiment.

As shown in FIG. 17, the semiconductor memory device according to the present modified example is provided with an insulating layer 45, not the variable resistance film 44, at an intersection of the conductive layer 33 (lower select gate line SGL) and the columnar semiconductor layer 43 (bit line BL) and an intersection of the conductive layer 34 (middle select gate line SGM) and the columnar semiconductor layer 43 (bit line BL). In other words, the variable resistance film 44 is divided in the Z direction between intersections of the conductive layer 42 (word line WL) and the columnar semiconductor layer (bit line BL). The insulating layer 45 is disposed between the variable resistance elements VR divided in the Z direction. This insulating layer 45 is configured from silicon oxide (SiO), for example. The insulating layer 45 is obtained by, for example, forming the variable resistance film 44 described using FIG. 9, and then after detaching the conductive layer 34 and the variable resistance film 44 contacting the conductive layer 34, oxidizing the columnar semiconductor layer 43.

By configuring in this way, a film quality of the gate insulating film between the lower select gate line SGL and middle select gate line SGM and the bit line BL improves, and leak current can be more suppressed.

Note that in the first embodiment, three layers of word lines are configured, but actually, by configuring many more layers, for example, 32 layers, it becomes possible to increase storage capacity per substrate area and provide a low cost memory. Assuming one middle select transistor STrM is provided at this time, it should be provided in a middle layer of the word lines, for example, a layer above the sixteenth layer from the bottom of the 32 layers. Moreover, two or more of the middle select transistors STrM may be provided.

In the first embodiment, the middle select gate line SGM was provided in a layer higher by a three-layer portion than the lower select gate line SGL, hence two layers of word lines WL were disposed between the lower select gate line SGL and the middle select gate line SGM. Even when there are 32 layers of word lines, the middle select gate line SGM may be disposed every two layers of word lines WL. Moreover, as shown in FIG. 17, the middle select gate lines SGM and the word lines WL may be disposed alternately. Configuring in this way results in a corresponding middle select gate line SGM being disposed for every one word line WL, hence a phenomenon of the current ending up flowing in a bit line BL more upward than the selected memory cell MC can be more finely suppressed. However, when the number of layers of word lines or middle select gate lines increases, a deeper memory hole must be formed, and yield in terms of process processing lowers. In other words, the number of layers of word lines or middle select gate lines has an optimum value for providing a low cost large capacity memory, due to degree of difficulty of process processing.

Second Embodiment

[Configuration]

Figure 11:
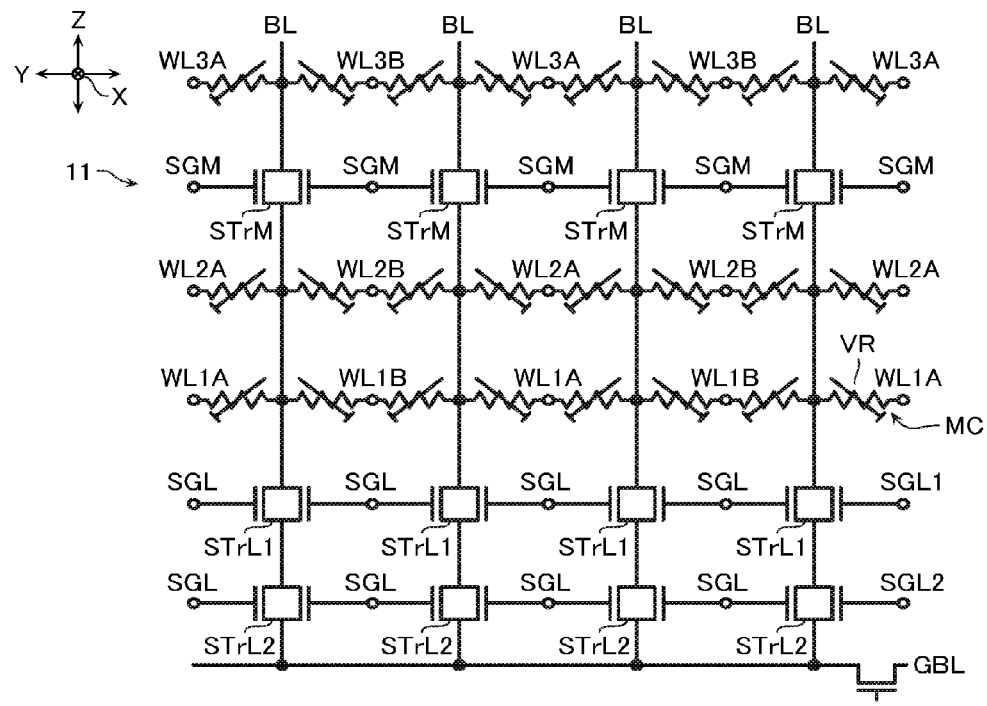
FIG. 11 is an example of an equivalent circuit diagram of a memory cell array 11 according to a second embodiment.
Figure 12:
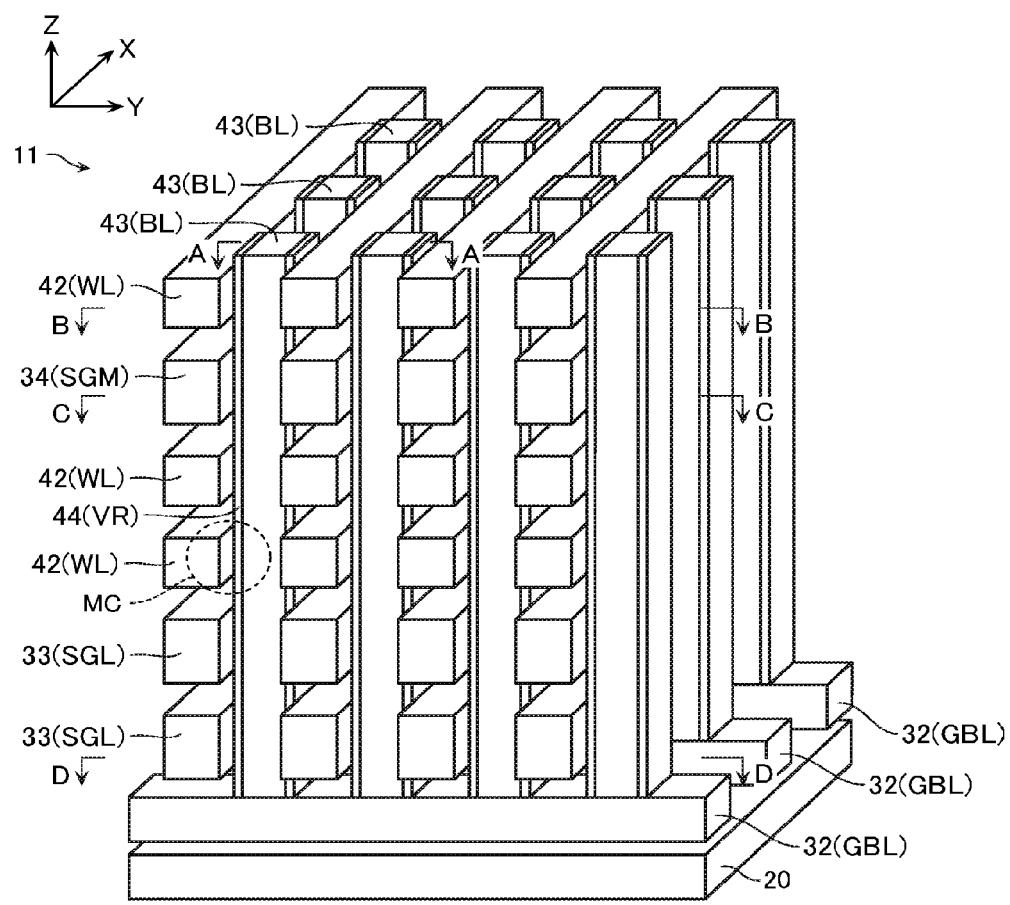
FIG. 12 is an example of a perspective view showing a structure of part of the memory cell array 11 included in the semiconductor memory device according to the second embodiment.
Figure 13:
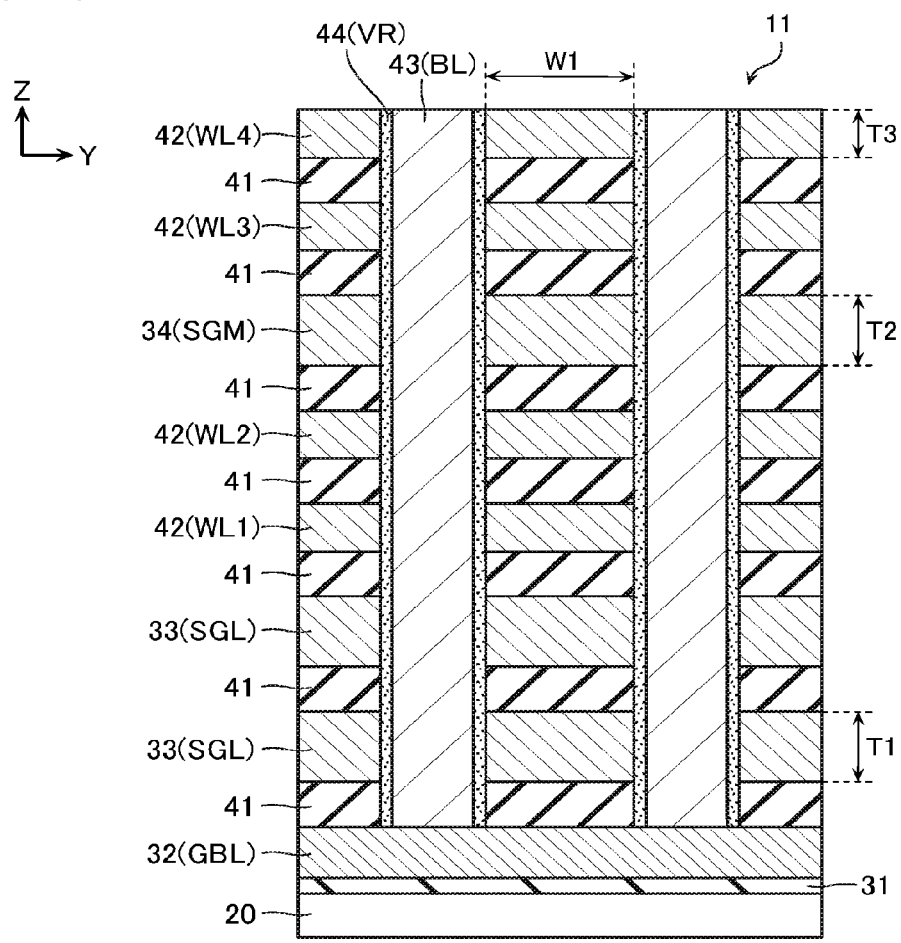
FIG. 13 is a Y-Z cross-sectional view, taken along the line A-A of FIG. 12, showing a configuration of part of the memory cell array 11 according to the second embodiment.
Figure 14:
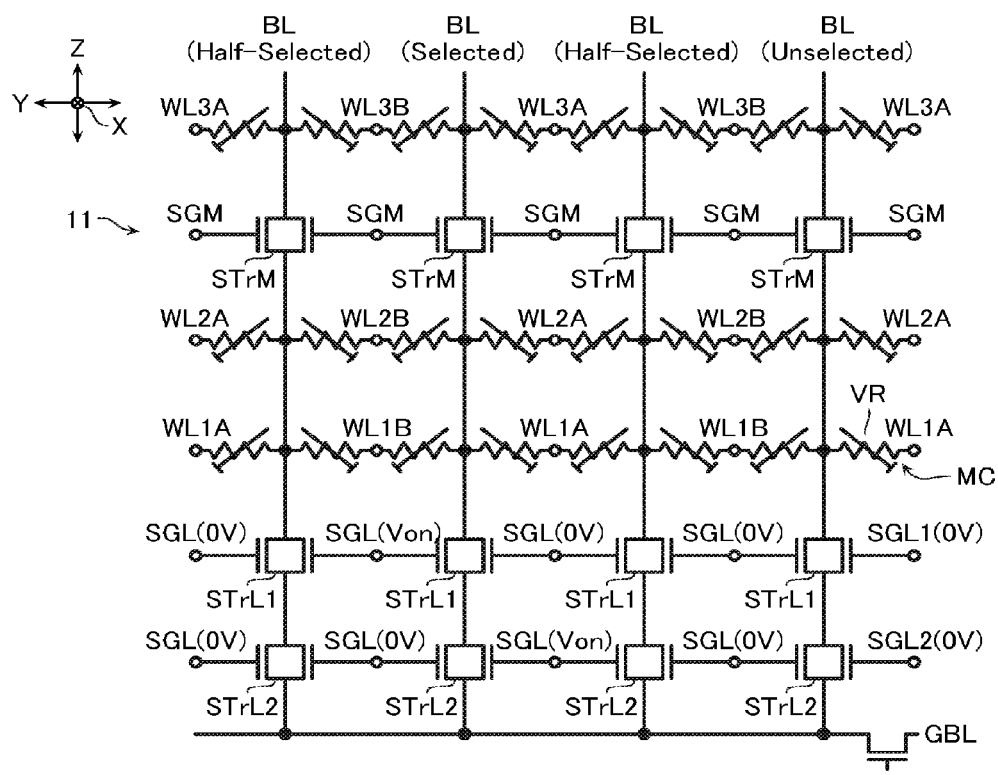
FIGS. 14 to 16 are examples of circuit diagrams for explaining an operation in the same memory cell array 11.
Figure 15:
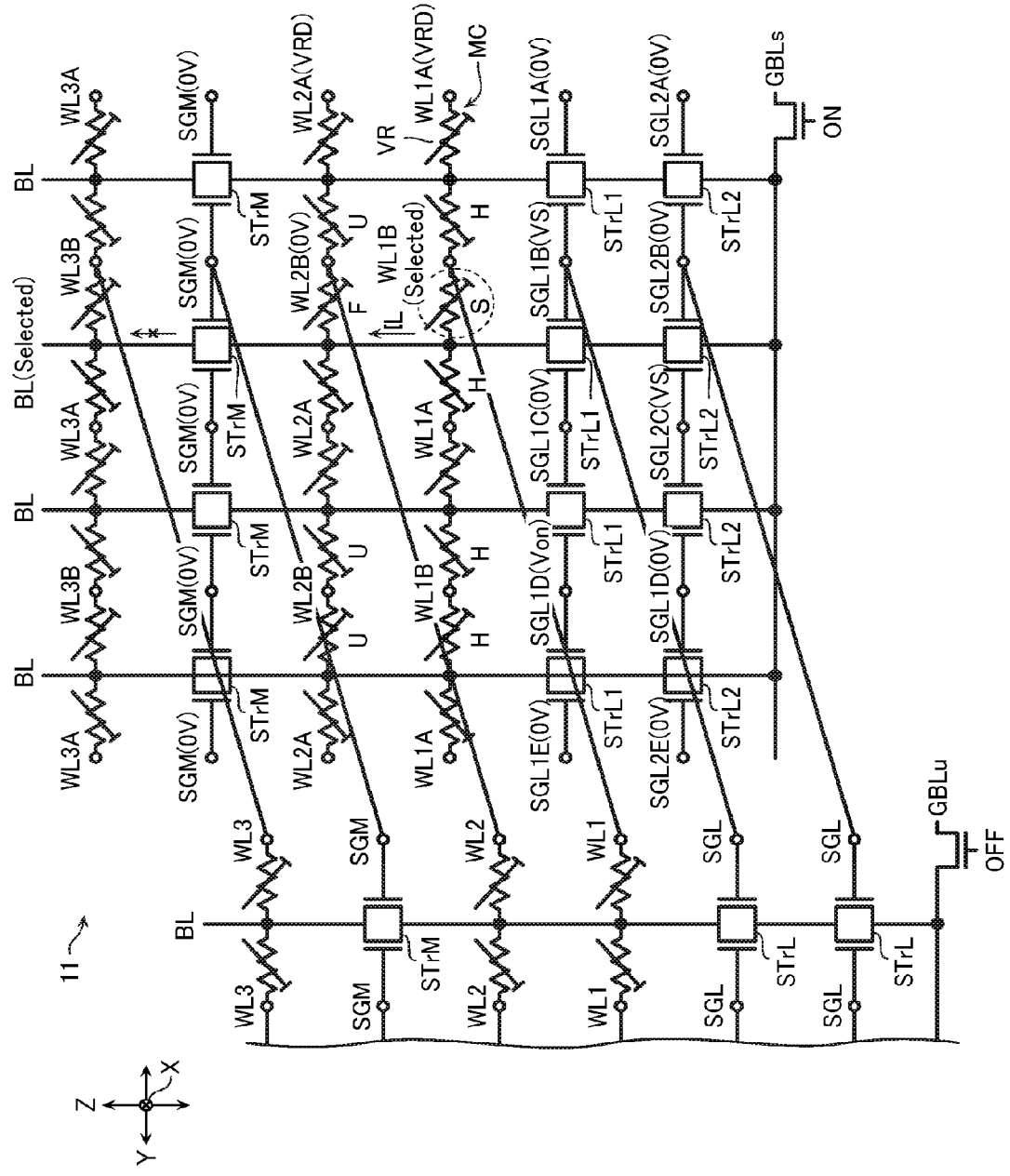
Figure 16:
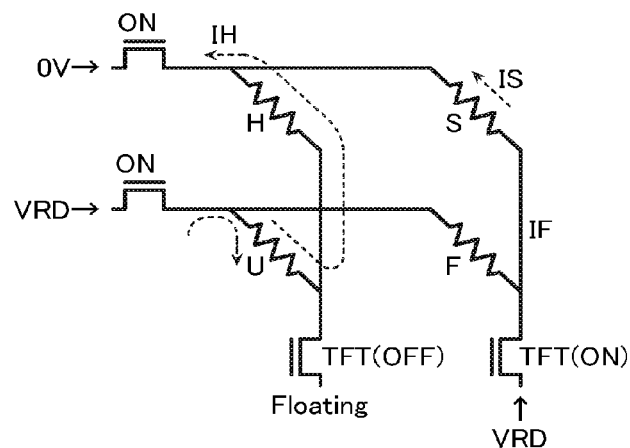

A semiconductor memory device according to a second embodiment will be described with reference to FIGS. 11 to 16. FIG. 11 is an equivalent circuit diagram of a memory cell array 11 according to the second embodiment. FIG. 12 is an example of a perspective view showing a schematic configuration of part of the same memory cell array 11. FIG. 13 is a cross-sectional view taken along the line A'-A' in FIG. 12. FIG. 14 is an example of a circuit diagram for explaining an operating principle of the same memory cell array 11. FIG. 15 is an example of a circuit diagram for explaining an operation of the same memory cell array 11. FIG. 16 is an example of a circuit diagram for explaining a current flowing during the same operation.

The memory cell array 11 according to the second embodiment has a configuration of the lower select transistor STrL which is different from that of the memory cell array 11 according to the first embodiment. Moreover, besides the configuration of the lower select transistor STrL, the memory cell array 11 according to the second embodiment is similar to the memory cell array 11 according to the first embodiment described employing FIGS. 1 to 10. Therefore, descriptions of portions identical to those of the first embodiment will be omitted below.

As shown in FIGS. 11 to 13, in the second embodiment, two layers of the lower select transistors STrL are provided. That is, two layers of lower select transistors STrL1 and STrL2 are provided adjacently in the Z direction between the lowermost layer word line WL1 and the global bit line GBL. Moreover, the two layers of lower select transistors STrL1 and STrL2 each have the substantially identical thickness T1. Now, it goes without saying that having a substantially identical thickness does not mean that all of the lower select transistors STrL1 and STrL2 necessarily have strictly identical thicknesses, but that they are manufactured under conditions such as to be of the same thickness and include a configuration such that average thicknesses of each could be regarded as substantially identical.

[Operation]

The operation of the memory cell array 11 according to the second embodiment will be described using the circuit diagrams of FIGS. 14 to 16.

First, a principle of selecting a desired bit line BL in the memory cell array 11 according to the second embodiment will be described using FIG. 14.

The memory cell array 11 according to the second embodiment includes two layers of lower select transistors STrL. Therefore, the desired bit line BL can be selected by adjusting voltage application to the two lower select transistors STrL1 and STrL2.

Specifically, as shown in FIG. 14, one of the word line WL1 side lower select gate lines SGL1 is applied with a voltage Von, and the other word line WL1 side lower select gate lines SGL1 are applied with 0 V. In addition, one of the global bit line GBL side lower select gate lines SGL2 adjacent in the Y direction to the word line WL1 side lower select gate line SGL1 applied with Von, is applied with the voltage Von. Thereupon, since the lower select transistors STrL1 and STrL2 positioned at both ends of the lower select gate lines SGL1 and SGL2 applied with the voltage Von become On, one desired bit line BL is selected. Moreover, the bit lines BL adjacent to the selected bit line BL attain a so-called half-selected state. However, one of the lower select transistors STrL1 or STrL2 series-connected to the half-selected bit line BL is in an Off state. Therefore, even the half-selected bit line BL is substantively in a similar state to an unselected bit line BL.

Based on the above-described principle, the operation in the present embodiment will be described using the circuit diagram of FIG. 15.

When selecting and reading one memory cell MC, the bit line BL corresponding to the memory cell MC to be selected (selected memory cell S) is selected by the column decoder 13. In other words, the lower select gate lines SGL1B and SGL2C corresponding to the bit line BL connected to the selected memory cell S are applied with a certain voltage VS. The other SGL1s and SGL2s are 0 V, and a select gate is set to Off. Simultaneously, a transistor of the global bit line GBLs corresponding to the selected memory cell S is set to On, and the voltage VRD is applied. Transistors of the other global bit lines GBLu are set to Off. Then, the word line WL1B connected to the selected memory cell S is applied with 0 V, and the other word lines WL1A and WL2A and WL2B are applied with VRD. As a result, a current flows from the global bit line GBLs into the word line WL1B via the selected memory cell S, and a resistance state of S can be understood by a magnitude of the current flowing in the word line WL1B.

As mentioned also in the first embodiment, the current flowing in the word line WL1B is not only via the selected memory cell S. Focusing on the word line WL1B, a current flows also from the word lines WL1A, WL2A, and WL2B applied with the voltage VRD, via an unselected memory cell U connected to an unselected BL, and from that unselected BL, via a half-selected memory cell H connected to WL1B. If the unselected bit lines BL and unselected word lines WL are simplified to single lines, then it becomes as in FIG. 16. In the present embodiment, as described above, since one of the lower select transistors STrL1 or STrL2 series-connected to the half-selected bit line BL is in an Off state, even the half-selected bit line BL is substantively in a similar state to the unselected bit line BL.

Actually, the number of half-elected memory cells H is proportional to the number of unselected bit lines BL connected to the same word line WL. Hence, when the word line WL is configured as two pairs of WLA and WLB, the number of half-selected memory cells H is roughly proportional to the product of the number of combs of the word line WL and the number of global bit lines GBL, in other words, the total number of unselected bit lines BL. Moreover, if the word lines WL are made independent and not in a comb shape, the number of half-selected memory cells H proportional to the number of global bit lines GBL. If there are few bit lines BL, the current via the half-selected memory cells H can be ignored, but when the number of bit lines BL becomes numerous, the number of half-selected memory cells H connected in parallel increases, and the current via the half-selected memory cells H becomes larger than that via the selected memory cell S. As a result, the resistance state of the selected memory cell S becomes difficult to determine. Although the word lines WL being independent results in the number of contacts increasing, it is desirable in terms of judgment of resistance.

Moreover, the number of unselected memory cells U is proportional to the product of the number of half-selected memory cells H and the number of layers of unselected word lines WL. In the present embodiment, the middle select transistor STrM positioned upwardly of the selected memory cell S is set to Off, whereby a current stops flowing in the unselected memory cells U in the bit lines BL upward of the middle select transistor STrM. In other words, it becomes easier for resistance judgment of the selected memory cell S to be made. There are more desirably few word lines WL, since the word lines WL and unselected memory cells U also are in parallel connection. The lower select gate line SGL need only be provided with the same potential as to the GL connected by the identical word line WL. In other words, if there is one pair of comb shaped SGLs, the number of contacts need only be one. However, if the word line WL has two pairs of comb shapes, then if the SGL also is configured as a comb shape, processing may be performed by an identical mask. Moreover, if the word lines WL are a large number of independent parallel lines not connected in the Y direction, then the SGLs may also be the same parallel lines. In this case, capacitance around the SGLs can be further reduced.

Third Embodiment

Figure 18:
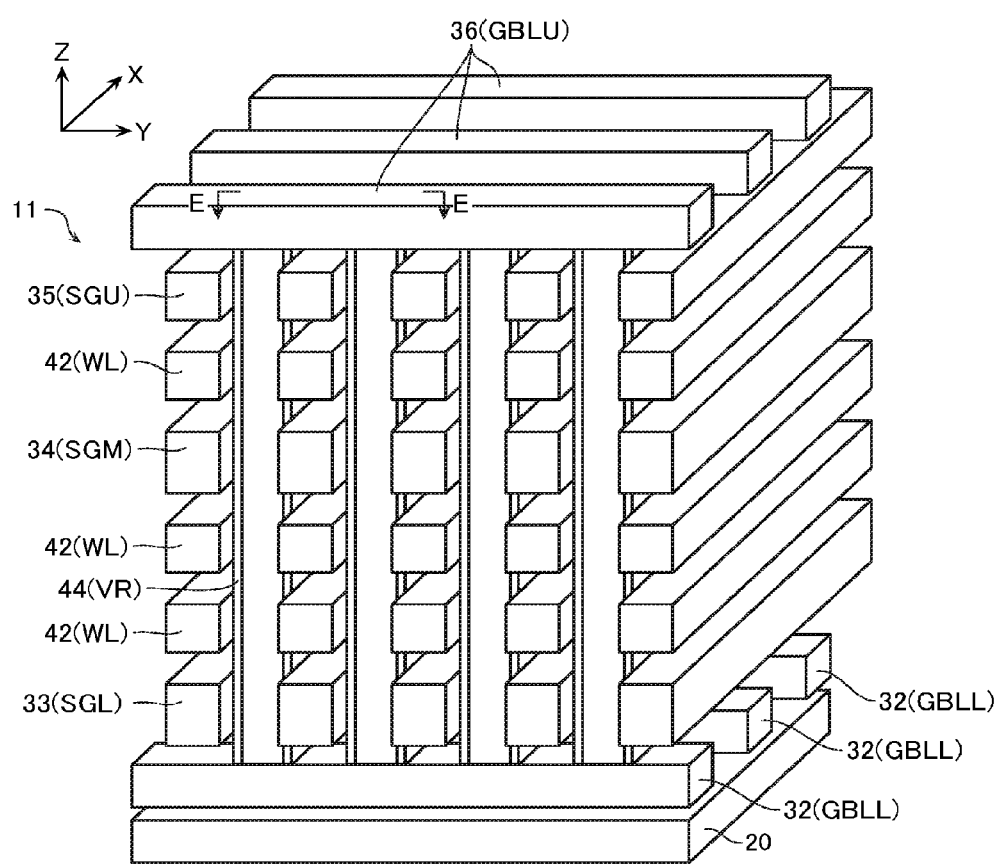
FIG. 18 is an example of a perspective view showing a configuration of part of a memory cell array 11 according to a third embodiment.
Figure 19:
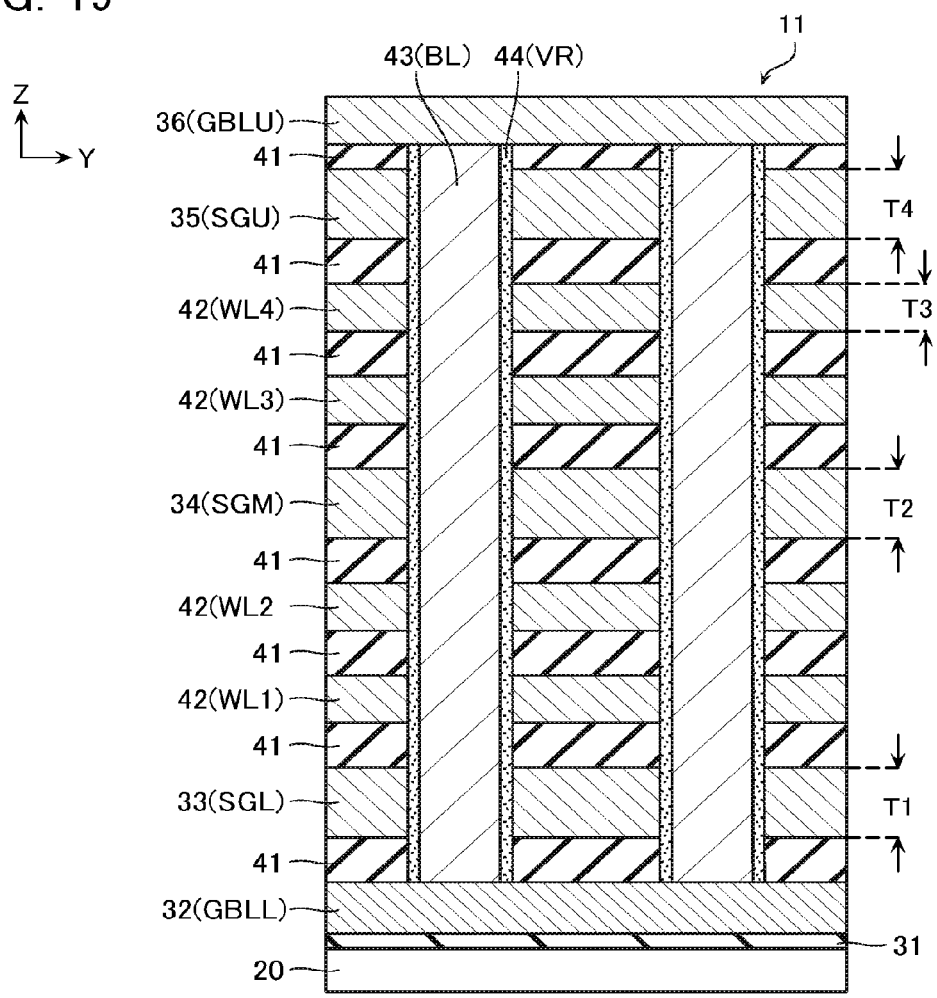
FIG. 19 is a Y-Z cross-sectional view, taken along the line E-E of FIG. 18, showing a configuration of part of the memory cell array 11 according to the second embodiment.

Next, a semiconductor memory device according to a third embodiment will be described with reference to FIGS. 18 and 19. FIG. 18 is an example of a perspective view showing a structure of part of a memory cell array 11 included in the semiconductor memory device according to the third embodiment. FIG. 19 is a Y-Z cross-sectional view taken along the line E-E of FIG. 18. Note that in the third embodiment, configurations similar to those of the first embodiment are assigned with reference symbols identical to those assigned in the first embodiment, and descriptions thereof will be omitted. Moreover, it is assumed below that the global bit line GBL in the first embodiment is treated as a lower global bit line GBLL.

As shown in FIGS. 18 and 19, the third embodiment includes not only the lower select gate line SGL and the lower global bit line GBLL disposed downwardly of the bit line BL, but also an upper select gate line SGU and an upper global bit line GBLU provided upwardly of the bit line BL.

As shown in FIGS. 18 and 19, a conductive layer 36 (upper global bit line GBLU) is connected to an upper end of the columnar semiconductor layer 43 (bit line BL). Moreover, the conductive layer 36 (upper global bit line GBLU) extends in the Y direction and is arranged in plurality in the X direction similarly to the conductive layer 32 (lower global bit line GBLL).

A conductive layer 35 (upper select gate line SGU) is provided between the upper global bit line GBLU and the uppermost layer conductive layer 42 (word line WL3). The upper select gate line SGU extends in the X direction similarly to the lower select gate line SGL and the middle select gate line SGM. Moreover, a thickness T4 in the Z direction of the upper select gate line SGU is greater than the thickness T3 in the Z direction of the word line WL, and is about the same as the thickness T1 in the Z direction of the lower select gate line SGL and the thickness T2 in the Z direction of the middle select gate line SGM.

By disposing the upper select gate line SGU also above the bit line BL in this way, the following advantage is obtained. That is, in the case such as where, for example, the selected memory cell MC is a memory cell MC corresponding to a word line WL disposed more upwardly than the uppermost layer middle select gate line SGM, the upper global bit line GBLU is applied with a certain voltage. Then, the selected memory cell MC is accessed by a potential difference between the upper global bit line GBLU and that corresponding word line WL. In addition, the middle select transistor STrM corresponding to the middle select gate line SGM is set to Off. It thus becomes possible to suppress a current flowing in the bit line BL more downward than the middle select gate line SGM. In other words, the half-selected memory cells can be reduced similarly to in the first embodiment.

Modified Example

A modified example according to the third embodiment will be described using FIG. 20

Figure 20:
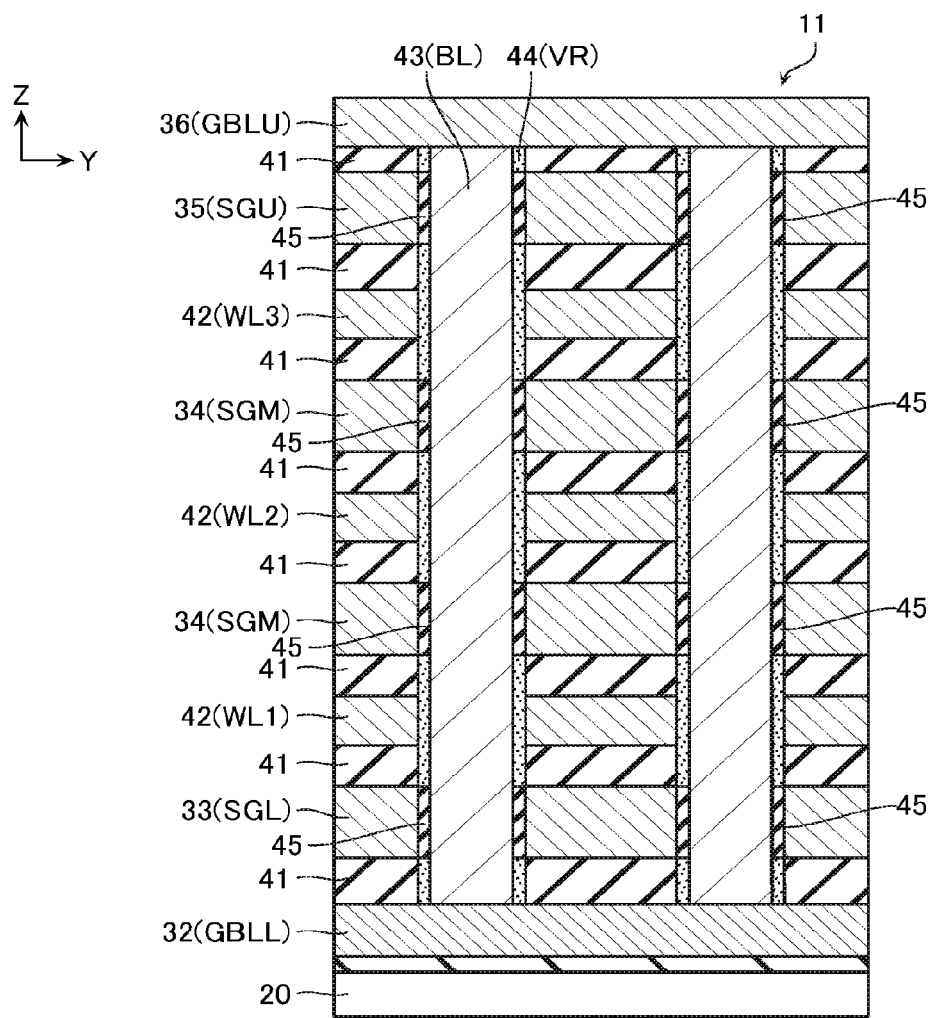
FIG. 20 is a Y-Z cross-sectional view showing a modified example of the same memory cell array 11.

FIG. 20 is a schematic cross-sectional view showing a configuration of part of a memory cell array 11 according to the modified example related to the third embodiment.

In the present modified example, a configuration of the variable resistance element VR and an arrangement of the middle select gate line SGM are different from those of the third embodiment.

As shown in FIG. 20, the semiconductor memory device according to the present modified example is provided with the insulating layer 45, not the variable resistance film 44, at intersections of the conductive layer 33 (lower select gate line SGL) and conductive layer 34 (middle select gate line SGM) and the columnar semiconductor layer 43 (bit line BL). In other words, the variable resistance film 44 is divided in the Z direction between intersections of the conductive layer 42 (word line WL) and the columnar semiconductor layer (bit line BL). The insulating layer 45 is disposed between the variable resistance elements VR divided in the Z direction. This insulating layer 45 is configured from silicon oxide (SiO), for example. The insulating layer 45 is obtained by, for example, forming the variable resistance film 44, and then after detaching the conductive layer 34 and the variable resistance film 44 contacting the conductive layer 34, oxidizing the columnar semiconductor layer 43, similarly to in the modified example described using FIG. 17.

By configuring in this way, a film quality of the gate insulating film between the lower select gate line SGL and middle select gate line SGM and the bit line BL improves, and leak current can be more suppressed.

Note that as described in the above-described embodiment or modified example, configuring the number of layers of word lines to be more numerous, for example, 32 layers makes it possible to increase storage capacity per substrate area and provide a low cost memory. Assuming one middle select transistor STrM is provided at this time, it should be provided in a middle layer of the word lines, for example, a layer above the sixteenth layer from the bottom of the 32 layers. Moreover, two or more of the middle select transistors STrM may be provided.

In the third embodiment, the middle select gate line SGM was provided in a layer higher by a three-layer portion than the lower select gate line SGL, hence two layers of word lines WL were disposed between the lower select gate line SGL and the middle select gate line SGM. Even when there are 32 layers of word lines, the middle select gate line SGM may be disposed every two layers of word lines WL. Moreover, as shown in FIG. 20, the middle select gate lines SGM and the word lines WL may be disposed alternately. Configuring in this way results in a corresponding middle select gate line SGM being disposed for everyone word line WL, hence a phenomenon of the current ending up flowing in a bit line BL more upward or more downward than the selected memory cell MC can be more finely suppressed. However, when the number of layers of word lines or middle select gate increases, a deeper memory hole must be formed, and yield in terms of process processing lowers. In other words, the number of layers of word lines or middle select gate has an optimum value for providing a low cost large capacity memory, due to degree of difficulty of process processing.

Other Modified Example

Figure 21:
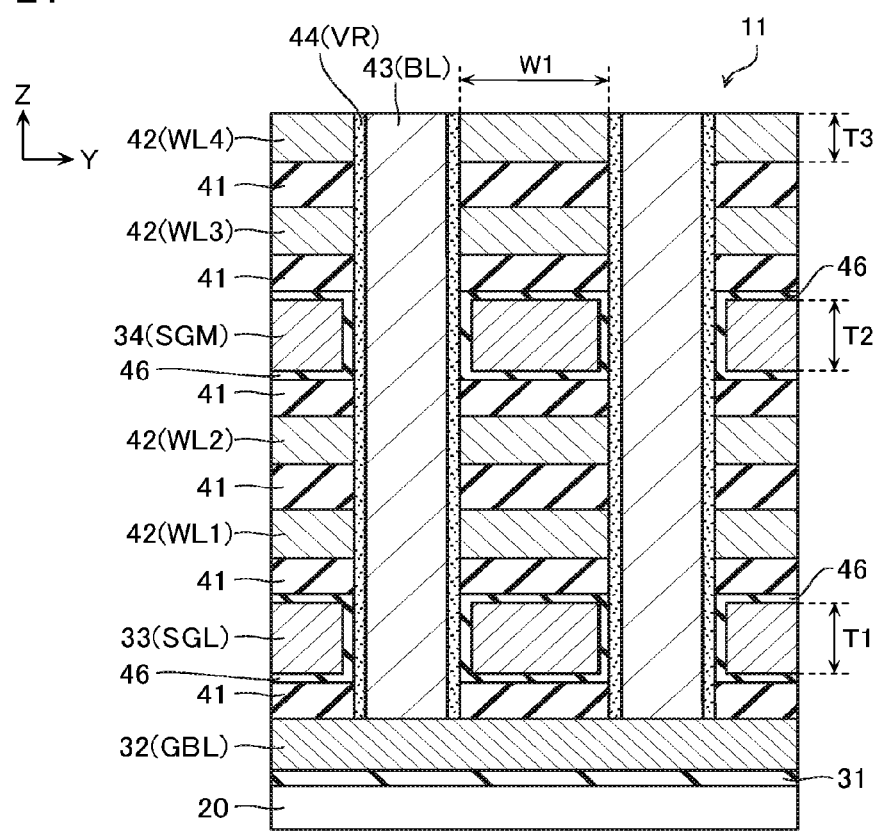
FIG. 21 is a cross-sectional view showing part of a memory cell array 11 according to yet another modified example.

A semiconductor memory device according to another modified example will be described using FIG. 21. The semiconductor memory device shown in FIG. 21 has an overall configuration which is largely identical to that of the semiconductor memory device according to the first embodiment. In the semiconductor memory device according to this modified example, peripheries of the lower select gate line SGL and the middle select gate line SGM are covered by an insulating layer 46. The insulating layer 46 is configured from an insulating material different from that of the variable resistance film 44. More specifically, the insulating layer 46 is preferably of a material of the kind where a filament path is not formed even when applied with the high voltage applied during the forming operation.

Having two kinds of insulating layers, namely, the variable resistance film 44 and the insulating layer 46 interposing between the select gate line SG and the bit line BL as in the present modified example makes it possible to further suppress occurrence of leak current.

The present modified example has a largely identical configuration to that of the memory cell array 11 according to the first embodiment, but may of course be applied also to the memory cell arrays 11 according to the other embodiments and modified examples.

Fourth Embodiment

A semiconductor memory device according to a fourth embodiment will be described using FIGS. 22 to 25.

Figure 22:
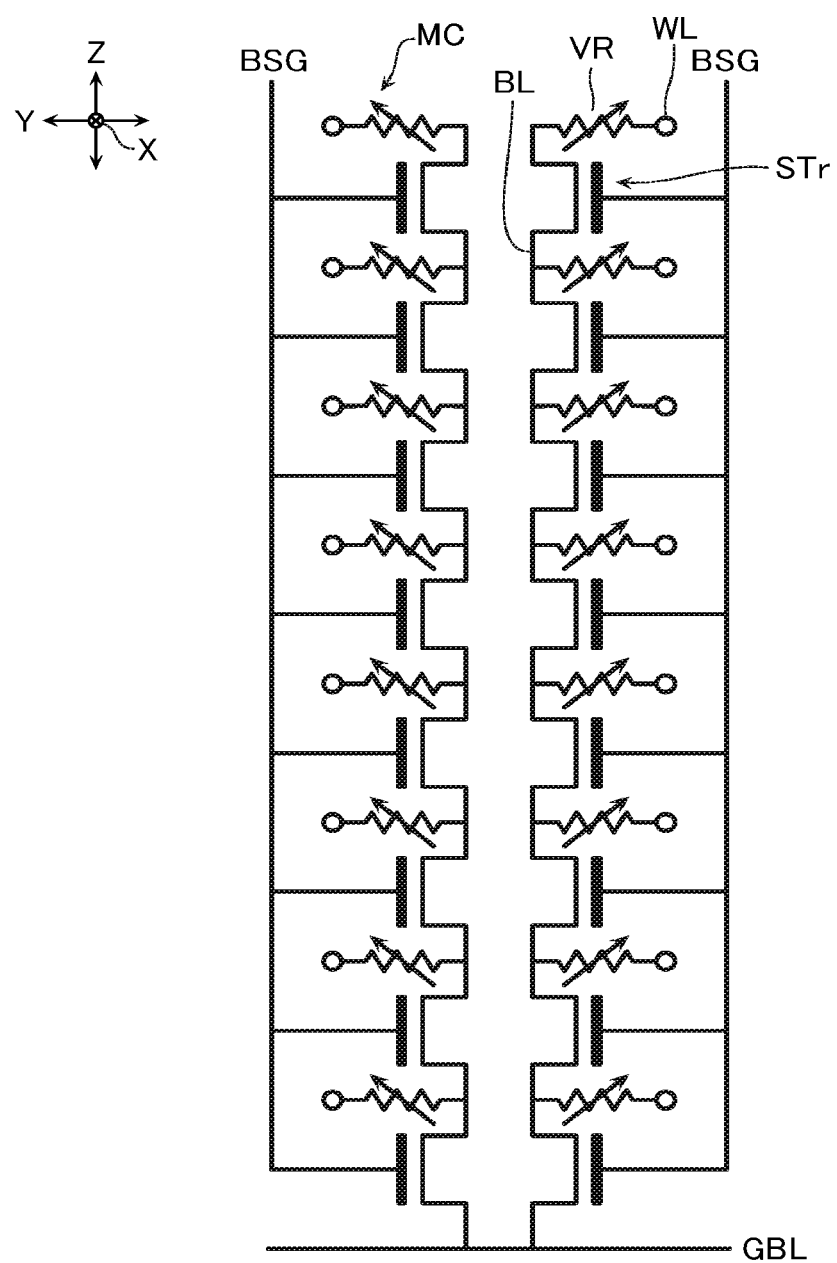
FIG. 22 is an example of an equivalent circuit diagram of a memory cell array 11 according to a fourth embodiment.

First, a schematic configuration of the semiconductor memory device according to the fourth embodiment will be described using FIGS. 22 and 23. FIG. 22 is an equivalent circuit diagram of the same semiconductor memory device; and FIG. 23 is a schematic perspective view showing a configuration of a memory cell array 11 included in the same semiconductor memory device.

Figure 23:
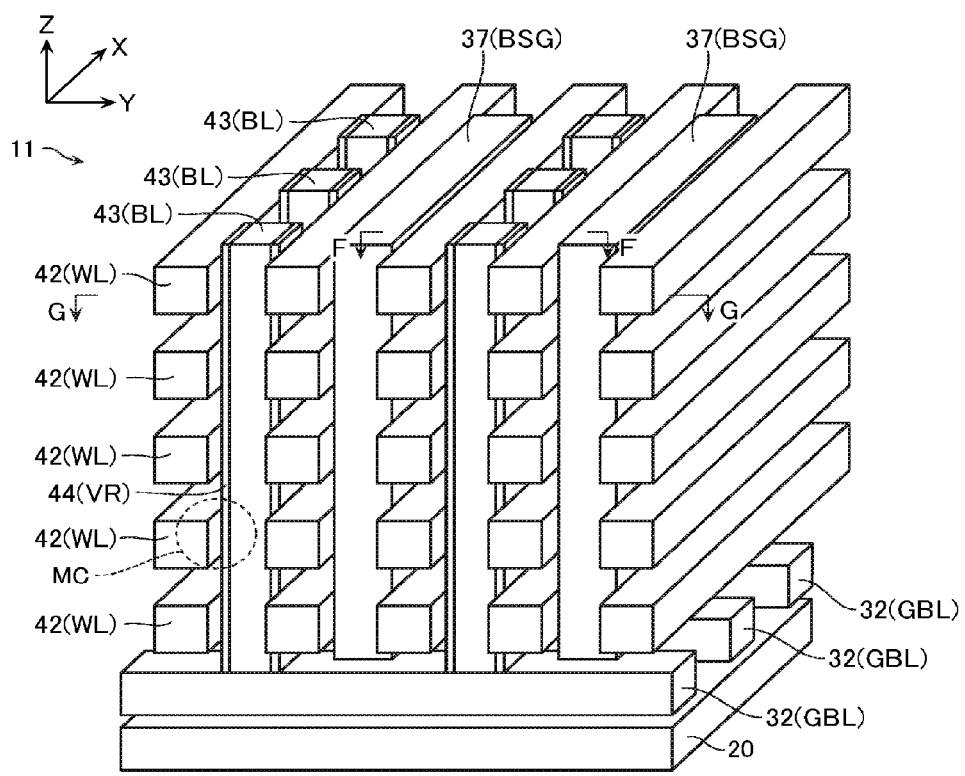
FIG. 23 is an example of a perspective view showing a configuration of part of the memory cell array 11 according to the fourth embodiment.

As shown in FIGS. 22 and 23, the semiconductor memory device in the fourth embodiment has the global bit line GBL, the bit line BL, the word line WL, and the variable resistance element VR provided on the substrate 20 similarly to the above-described embodiments. The global bit lines GBL each extend in the Y direction and are arranged in plurality in the X direction. The bit lines BL each extend in a column shape in the Z direction and are arranged in plurality in the X direction. Moreover, a lower end of the bit line BL is connected to the global bit line GBL. The word lines WL each extend in the X direction and are arranged in plurality in the Z direction. The memory cell MC is provided at an intersection of the word line WL and the bit line BL. Moreover, the memory cell MC includes the variable resistance element VR.

Moreover, in the fourth embodiment, as shown in FIG. 23, a back select gate electrode BSG is provided facing a side surface in the Y direction on an opposite side to a side surface in the Y direction facing the bit line BL, of the word line WL. A lower end of the back select gate electrode BSG is separated from the global bit line GBL.

In the present embodiment, the memory cell MC to be accessed is selected using this back select gate electrode BSG. That is, the back select gate electrode BSG functions as a select gate of the semiconductor memory device according to the present embodiment.

Specifically, by applying a certain voltage to the back select gate electrode BSG connected to the memory string including the selected memory cell MC, the select transistor STr having that back select gate electrode as its gate is set to On. Moreover, the memory cell MC is accessed by a potential difference between the global bit line GBL and the word line WL corresponding to the selected memory cell MC.

Next, the configuration of the memory cell array 11 in the fourth embodiment will be described in detail using FIGS. 24 and 25.

Figure 24:
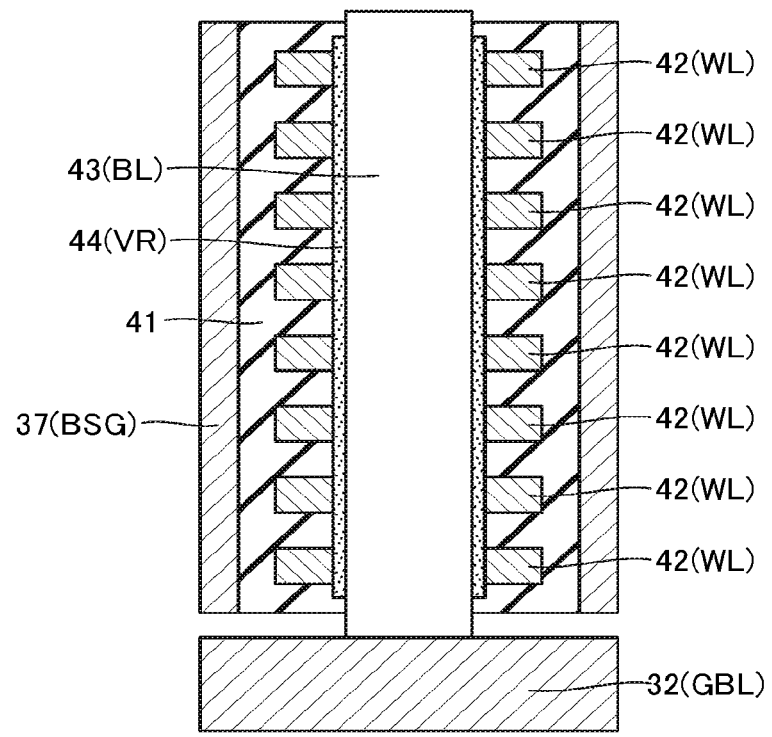
FIG. 24 is a Y-Z cross-sectional view, taken along the line F-F of FIG. 22, showing a configuration of the memory cell array 11 according to the fourth embodiment.

FIG. 24 is a Y-Z cross-sectional view taken along the line F-F of FIG. 23 showing a configuration of part of the memory cell array 11. FIG. 25 is an X-Y cross-sectional view taken along the line G-G of FIG. 22.

Figure 25:
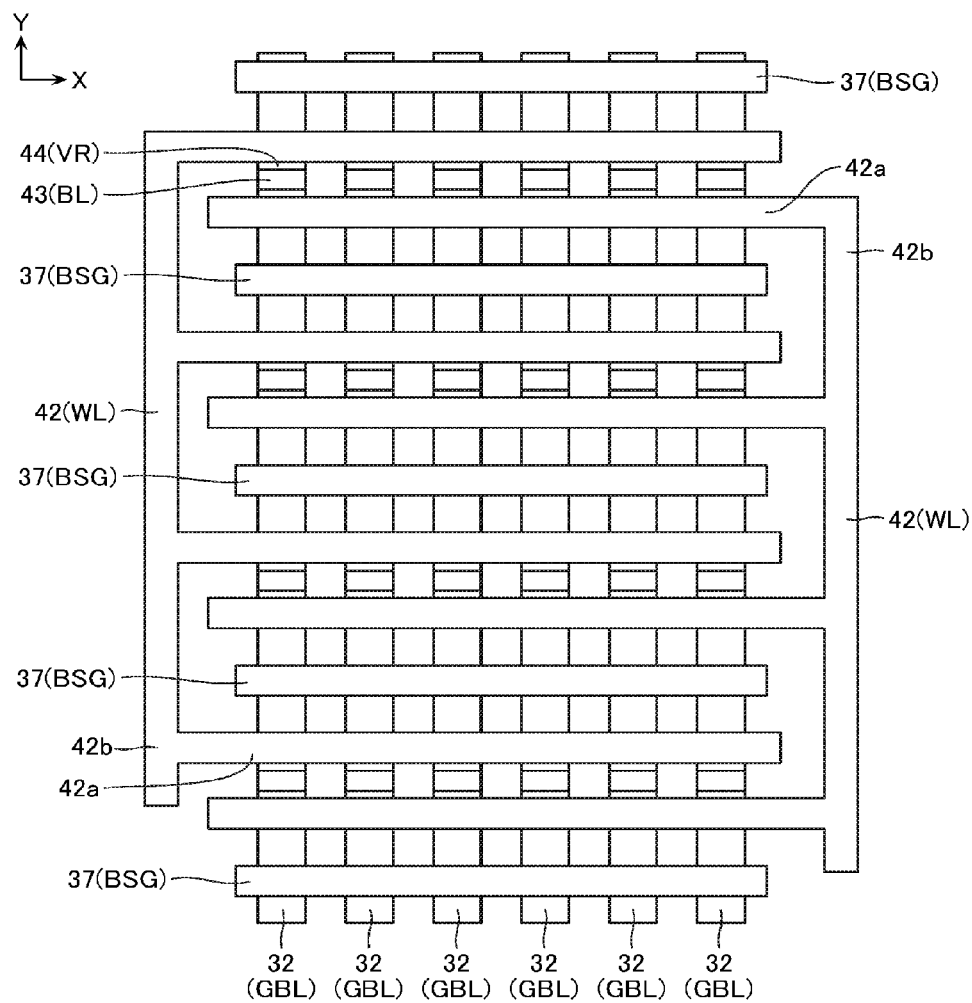
FIG. 25 is an X-Y cross-sectional view of the same memory cell array 11, taken along the line G-G in FIG. 22.

As shown in FIGS. 24 and 25, the memory cell array 11 includes the conductive layer 32 and the conductive layer 42 provided on an unillustrated substrate.

Moreover, as shown in FIG. 24, the memory cell array 11 includes the columnar semiconductor layer 43 and the variable resistance film 44.

The conductive layer 32 extends in the Y direction and is arranged in plurality in the X direction as shown in FIG. 25. Moreover, the conductive layer 32 functions as the global bit line GBL. The conductive layer 32 is configured from a metal such as tungsten (W), for example.

As shown in FIG. 25, the conductive layer 42 extends in the X direction and is configured from: a plurality of branch parts 42a arranged in the Y direction; and a connecting part 42b commonly connected to ends in the X direction of the branch parts 42a. In this way, the conductive layer 42 is configured in a comb tooth shape. Moreover, the conductive layer 42 functions as the word line WL. The conductive layer 42 is configured from polysilicon or a metal, for example.

As shown in FIGS. 24 and 25, the columnar semiconductor layer 43 extends in a column shape in the Z direction so as to penetrate a stacked body of the inter-layer insulating layer 41 and the conductive layer 42. The variable resistance film 44 is provided on a side surface in the Y direction of the columnar semiconductor layer 43. The columnar semiconductor layer 43 functions as the bit line BL. The variable resistance film 44 functions as the variable resistance element VR.

The columnar semiconductor layer 43 is configured by polysilicon, for example; and the variable resistance film 44 is configured by, for example, a metal oxide (for example, $HfO_x$, $Al_2O_x$, $TiO_x$, $NiO_x$, $WO_x$, $Ta_2O_x$, and so on).

Moreover, as shown in FIGS. 24 and 25, the present embodiment is provided with a conductive layer 37. As shown in FIG. 23, the conductive layer 37 is provided extending in the Z direction on an opposite side to the columnar semiconductor layer (bit line BL) with respect to the conductive layer 42 (word line WL), so as to straddle a plurality of the conductive layers 42. The conductive layers 37 each have a plate-like shape extending in the X direction and the Z direction, and are arranged in the Y direction so as to straddle a plurality of the columnar semiconductor layers 43 disposed along the X direction. The conductive layer 37 functions as the back select gate electrode BSG. Since the select gate due to the back gate BSG and the bit line BL are separated, a larger voltage is applied when setting the select transistor to On, compared to in the first embodiment.

Figure 26:
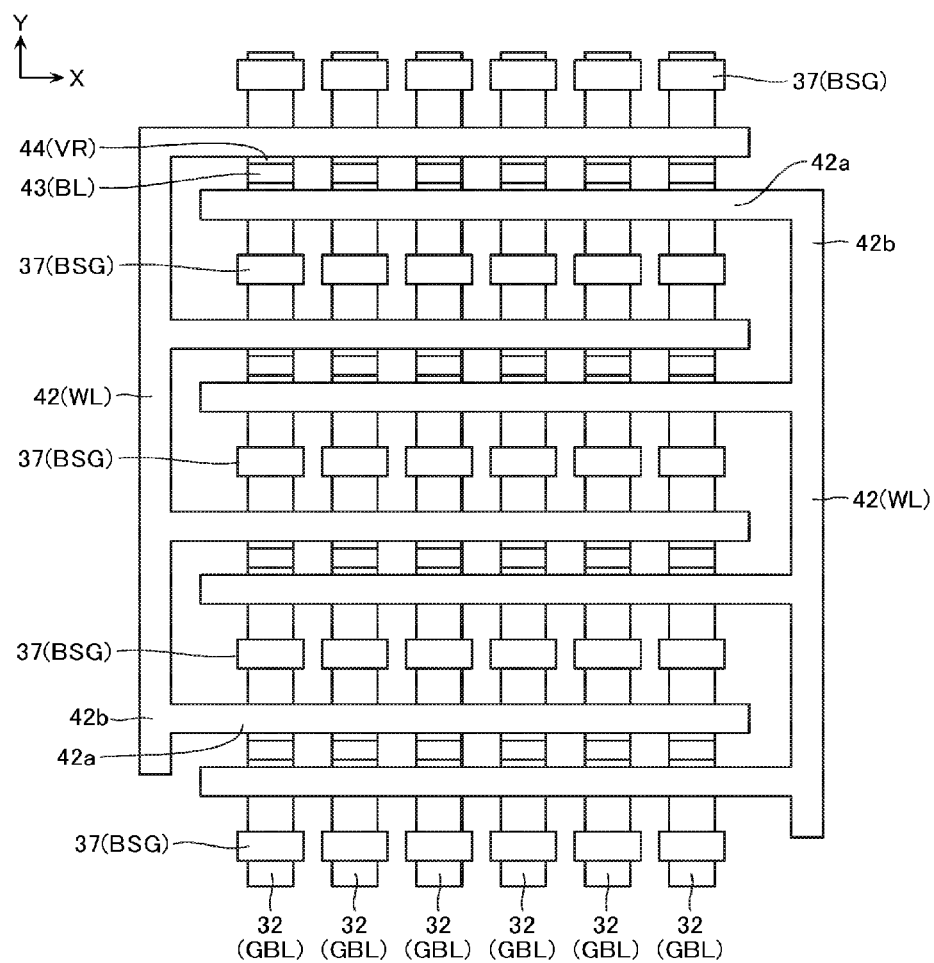
FIG. 26 is an example of an X-Y cross-sectional view showing a modified example of the same memory cell array 11.

Note that in the present embodiment, the back select gate electrode BSG has a plate-like shape extending in the X direction and the Z direction as shown in FIGS. 24 and 25. However, the present embodiment is not limited to this, and as shown in FIG. 26, the back select gate electrode BSG may be divided in the X direction so as to face side surfaces in the Y direction of the bit line BL and the variable resistance element VR. At that time, the multiply-divided back select gate electrodes BSG may have a common wiring line connected thereto and be commonly controlled, or may have separate wiring lines connected thereto and be each independently controlled.

Due to such a configuration, a distance between the back select gate electrode BSG functioning as the select gate and a surface in the Y direction of the bit line BL which is a channel where the current flows, is shortened, hence a voltage for setting the select transistor to On can be lowered.

Modified Example

A modified example of the semiconductor memory device according to the fourth embodiment will be described using FIG. 27.

Figure 27:
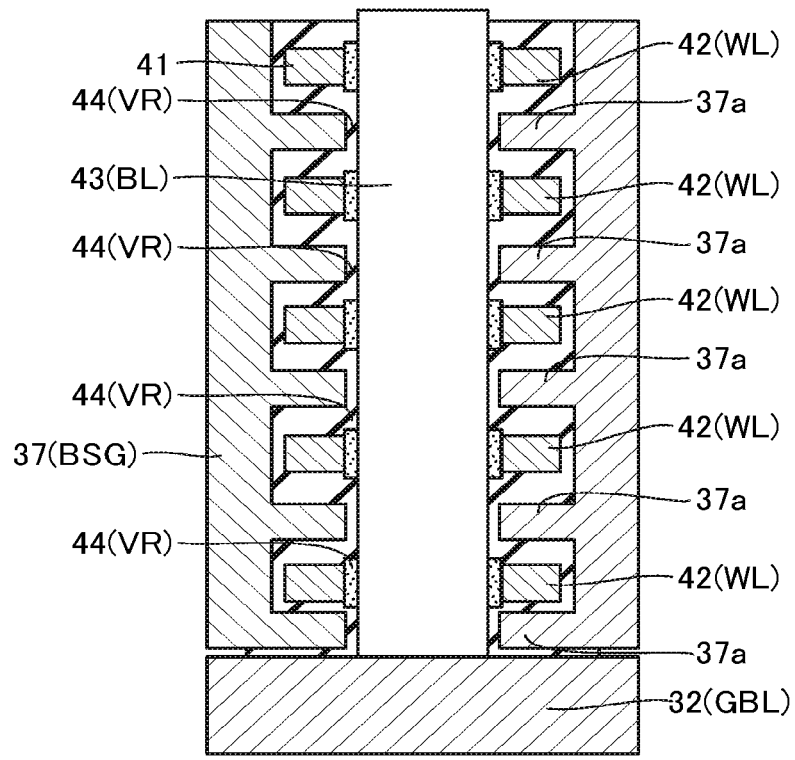
FIG. 27 is a Y-Z cross-sectional view showing another modified example of the same memory cell array 11.

FIG. 27 is a Y-Z cross-sectional view showing a configuration of part of the semiconductor memory device according to the modified example related to the fourth embodiment.

As shown in FIG. 27, in the semiconductor memory device according to the modified example, the back select gate electrode BSG includes a projecting part 37a projecting in the X direction, between the conductive layers 42 adjacent in the Z direction.

By adopting such a configuration, the distance between the back select gate electrode BSG functioning as the select gate and the columnar semiconductor layer 43 functioning as the bit line BL, becomes even smaller, and selection controllability improves by the back select gate electrode BSG.

In addition, the variable resistance film 44 functioning as the variable resistance element VR is provided only at an intersection of the conductive layer 42 and the columnar semiconductor layer 43, and is not provided at least at a place where a side surface in the X direction of the projecting part 37a and a side surface of the columnar semiconductor layer 43 face each other. That is, the variable resistance film 44 is divided between intersections of the conductive layer 42 and the columnar semiconductor layer.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, including a memory cell array, the memory cell array including a plurality of memory cells, the memory cell array comprising:

a plurality of first conductive layers that are stacked in a first direction above a substrate and extend in a second direction intersecting the first direction;

a plurality of second conductive layers that are stacked in the first direction above the substrate and extend in the second direction, the plurality of second conductive layers being adjacent to the plurality of the first conductive layers in a third direction intersecting the first direction and the second direction;

a third conductive layer extending in the first direction;

a first variable resistance film provided at intersections of the plurality of first conductive layers and the third conductive layer;

a second variable resistance film provided at intersections of the plurality of second conductive layers and the third conductive layer;

a first select transistor disposed closer to the substrate than a lowermost layer of the plurality of first conductive layers, the first select transistor including a first select gate line intersecting the third conductive layer;

a fourth conductive layer that extends in the third direction and is connected to a lower end of the third conductive layer via the first select transistor; and a second select transistor disposed between at least one pair of the plurality of first conductive layers adjacent in the first direction, the second select transistor including a second select gate line intersecting the third conductive layer.

2. The semiconductor memory device according to claim 1, wherein two layers of the first select gate lines are provided continuously via an inter-layer insulating film along the first direction.

3. The semiconductor memory device according to claim 1, wherein the second select gate line has an average width substantially identical to that of the first conductive layer in a direction orthogonal to the first direction and the second direction.

4. The semiconductor memory device according to claim 1, wherein in the first direction, an average of thickness of the second select gate line is larger than an average of thickness of the first conductive layer.

5. The semiconductor memory device according to claim 1, further comprising:
a fifth conductive layer extending in the third direction and electrically connected to an upper end of the third conductive layer; and
a third select transistor disposed between the fifth conductive layer and an uppermost layer of the plurality of first conductive layers, the third select transistor including a third select gate line intersecting the third conductive layer.

6. The semiconductor memory device according to claim 1, wherein one of the first conductive layers is configured from a plurality of regions that are electrically independent.

7. The semiconductor memory device according to claim 1, wherein the second select gate line disposed between the plurality of first conductive layers adjacent in the first direction has a shape substantially identical to that of one of the first conductive layers when viewed in the first direction.

8. The semiconductor memory device according to claim 1, wherein the first variable resistance film is divided between intersections of the plurality of first conductive layers and the third conductive layer, and an insulating layer is disposed between the first variable resistance films divided in the first direction.

9. The semiconductor memory device according to claim 1, wherein the first variable resistance film is disposed between the first select gate line and the third conductive layer.

10. The semiconductor memory device according to claim 1, wherein an insulating film including silicon is disposed between the first select gate line and the third conductive layer.

11. The semiconductor memory device according to claim 1, further comprising:
a plurality of sixth conductive layers that are stacked in the first direction above the substrate and extend in the second direction, the plurality of sixth conductive layers being adjacent to the plurality of second conductive layers in the third direction;
a seventh conductive layer that is provided between the plurality of sixth conductive layers and the plurality of second conductive layers and extends in the first direction;
a third variable resistance film provided at intersections of the plurality of second conductive layers and the seventh conductive layer; and
a fourth variable resistance film provided at intersections of the plurality of sixth conductive layers and the seventh conductive layer.

12. The semiconductor memory device according to claim 11, wherein the plurality of the first conductive layers and the plurality of sixth layers are electrically connected via an electrode member that is made of an identical material to the plurality of first conductive layers and the plurality of sixth layers and is extending in the third direction.

13. The semiconductor memory device according to claim 1, further comprising:
an eighth conductive layer that is provided adjacent to the third conductive layer in the second direction and between the plurality of first conductive layers and the plurality of second layers, the eighth conductive layer being extending in the first direction; and
an insulating layer provided between the third conductive layer and the eighth conductive layer.

* * * * *